United States Patent
Tayanaka et al.

(10) Patent No.: US 8,817,164 B2
(45) Date of Patent: Aug. 26, 2014

(54) SOLID-STATE IMAGING DEVICE AND IMAGING APPARATUS HAVING OFFSET OPTICAL WAVEGUIDES

(71) Applicant: Sony Corporation, Tokyo (JP)

(72) Inventors: Hiroshi Tayanaka, Kanagawa (JP); Susumu Ooki, Kumamoto (JP); Junichi Furukawa, Kanagawa (JP); Fumiaki Okazaki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/756,124

(22) Filed: Jan. 31, 2013

(65) Prior Publication Data

US 2013/0234220 A1 Sep. 12, 2013

Related U.S. Application Data

(63) Continuation of application No. 12/728,549, filed on Mar. 22, 2010, now Pat. No. 8,390,726.

(30) Foreign Application Priority Data

Mar. 31, 2009 (JP) ................. 2009-088093
Mar. 31, 2009 (JP) ................. 2009-088094

(51) Int. Cl.
*H04N 5/225* (2006.01)
*H04N 3/14* (2006.01)
*H04N 5/335* (2011.01)

(52) U.S. Cl.
USPC .......................... 348/340; 348/302

(58) Field of Classification Search
USPC ........................... 348/302–308, 340
See application file for complete search history.

(56) References Cited

U.S. PATENT DOCUMENTS

2006/0152616 A1* 7/2006 Vaillant ................. 348/340
2008/0252742 A1* 10/2008 Oike .................... 348/222.1
2009/0002531 A1* 1/2009 Godaiin ................ 348/294

FOREIGN PATENT DOCUMENTS

| JP | 2006-261247 | 9/2006 |
| JP | 2006-261249 | 9/2006 |
| JP | 2006-303468 | 11/2006 |
| JP | 2006-324439 | 11/2006 |

* cited by examiner

*Primary Examiner* — Kelly L Jerabek
(74) *Attorney, Agent, or Firm* — Sheridan Ross P.C.

(57) ABSTRACT

An imaging device includes a basic cell having two or more the pixels that share floating diffusion. The imaging device also includes a transistor shared by the two or more pixels in the basic cell and arranged on the outside of the two or more pixels. The imaging device further includes a light receiving unit connected to the floating diffusion shared by the pixels in the basic cell through a transfer gate. In the imaging device, on-chip lenses are arranged substantially at regular intervals. Also, an optical waveguide is formed so that the position thereof in the surface of the solid-state imaging device is located at a position shifted from the center of the light receiving unit to the transistor and in the inside of the light receiving unit and the inside of the on-chip lens.

9 Claims, 35 Drawing Sheets

| Gb | B | Gb | B | Gb | B |
|----|----|----|----|----|----|
| R | Gr | R | Gr | R | Gr |
| Gb | B | Gb | B | Gb | B |
| R | Gr | R | Gr | R | Gr |
| Gb | B | Gb | B | Gb | B |
| R | Gr | R | Gr | R | Gr |

SOLID-STATE IMAGING DEVICE AND IMAGING APPARATUS HAVING OFFSET OPTICAL WAVEGUIDES

RELATED APPLICATION DATA

This application is a continuation of U.S. patent application Ser. No. 12/728,549 filed Mar. 22, 2010, the entirety of which is incorporated herein by reference to the extent permitted by law. The present application also claims priority to Japanese Priority Patent Application No. JP 2009-088094 filed Mar. 31, 2009 and Japanese Priority Patent Application No. JP 2009-088093 filed Mar. 31, 2009, the entirety of which is incorporated by reference herein to the extent permitted by law.

BACKGROUND OF THE INVENTION

1. Field of the Invention

The present invention relates to a solid-state imaging device with an optical waveguide on a light receiving unit and also relates to an imaging apparatus provided with such a solid-state imaging device.

2. Description of the Related Art

In a solid-state imaging device, the more the distance from the center of the imaging device to a pixel increases, the more the incident angle of light on the pixel increases. Thus, the amount of light incident on the photoelectric conversion unit (light receiving unit) decreases if the uppermost lens is located just above a photoelectric conversion unit (light receiving unit).

Then, there is proposed a solid-state imaging device in which the horizontal position of each of the lens and the photoelectric conversion unit (light receiving unit) is shifted depending on the distance from the center of the imaging device to the pixel to place the lens near the center of the imaging device (see, for example, Japanese Patent Laid Open Nos. 2006-261247, 2006-261249, and 2006-324439). Such a configuration of the imaging device can allows the more amount of the slanting incident light passed through the lens to enter the photoelectric conversion unit (light receiving unit), resulting in sufficient sensitivity. The shifting of the horizontal positions of structural components, such as a lens and a light receiving unit, in this way is referred to as "pupil correction". In other words, the term "pupil correction" means that an on-chip lens is shifted to an appropriate position to take measures against a fact that the incident light is not vertically incident on the periphery of a pixel but obliquely incident thereon.

In Japanese Patent Laid Open No. 2006-261249, furthermore, an optical waveguide is provided between a lens and a light receiving unit. Then, the lens, the optical waveguide, and the light receiving unit are shifted in the horizontal direction so that the distances from the center of the imaging device to the lens, the optical waveguide, and the light receiving unit increase in this order with an increase in distance from the center of the imaging device to the pixel.

By the way, in the typical CMOS type solid-stage imaging device, a transistor and a floating diffusion are provided for every pixel. The presence of the transistor and the floating diffusion in each pixel restricts the production of a finer pixel. The finer the pixel is made, the more the surface area of the light receiving unit decreases. As a result, a decrease in amount of electric charges occurs. Thus, the resulting pixel may tend to be a very dark pixel and also random noise may tend to overlap an image signal.

To avoid such phenomena, there is proposed another imaging device in which a transistor and a floating diffusion are shared by two or more pixels to decrease the surface area of the pixel occupied by these elements while increasing the surface area thereof occupied by the light receiving unit (see, for example, Japanese Patent Laid Open No. 2006-303468).

SUMMARY OF THE INVENTION

The formation of an optical waveguide includes the step of burying a material in the inside thereof. However, if a pixel is made finer, then the opening size of the optical waveguide is made smaller. It causes a decrease in quality of burying in the optical waveguide because of facilitated generation of an air bubble or the like in the manufacturing process. Thus, there is a limit in miniaturization of a pixel having an optical waveguide. Therefore, a decrease in quality of burying of the optical waveguide as described above leads to widely varied qualities of burying the optical waveguides in the respective pixels, resulting in a decrease in manufacturing yield of the pixels.

To avoid such disadvantages, there is an idea like the one described in Japanese Patent Laid Open No. 2006-303468 in which a solid-imaging device having an optical waveguide is designed so that two or more pixels share a transistor and a floating diffusion. The sharing of the transistor and the floating diffusion by two or more pixels can extend the surface area of the light receiving unit per pixel as compared with an unshared case. In other words, the reduction of the surface area of the light receiving unit can be diminished when the pixel is made finer. Thus, the reduction of the opening size of the optical waveguide can be also diminished.

In the case of the typical pixels with unshared transistors and floating diffusions, the distance between the adjacent light receiving units is almost constant regardless of whether pupil correction is performed.

However, when the transistor and the floating diffusion are shared by two or more pixels, the distance between the light receiving units varies. This is because the location of the light receiving unit is shifted to the shared floating diffusion and the transistor is arranged on the side opposite from the floating diffusion (outside). On the other hand, on-chip lenses are preferably arranged almost at regular distances. If the distances between on-chip lenses are unequal, a region without converged incident light, or an invalid zone, becomes extended in a portion with a relatively wide distance between the on-chip lenses when the on-chip lenses of the respective pixels are prepared in the same diameter and the same curvature. Therefore, the light receiving units arranged at irregular intervals and the on-chip lenses arranged substantially at regular intervals are shifted to some extent from their predetermined positions on a plane with respect to each other. In the case of carrying out pupil correction on the on-chip lens, they are also shifted from their predetermined positions on a plane in the direction different from the direction of pupil correction.

Here, as described above, consideration is given to a case in which an optical waveguide is provided between a light receiving unit and an on-chip lens in a state that the light receiving unit and the on-chip lens are out of alignment on a plane with respect to each other. If the optical waveguide is under the center of an on-chip lens, part of the optical waveguide may protrude from the light receiving unit. In this instance, light passing through the protruded portion of the optical waveguide is difficult to be photoelectrically converted. Therefore, the sensitivity of the light receiving unit decreases and the efficiency of photoelectric conversion thereof also decreases. In this case, furthermore, the optical waveguide may be partially placed over the optical waveguide of the adjacent pixel and cause mixed colors. On the other hand, if the optical waveguide is arranged on the center of the light receiving unit, the optical waveguide is displaced from the center of the on-chip lens. Therefore, it becomes difficult to introduce the light collected with the on-chip lens into the optical waveguide. The light is wasted when it is not introduced into the optical waveguide. In this case, the sensitivity of the light receiving unit decreases and the efficiency of photoelectric conversion thereof also decreases just as one described above.

In the configuration of the imaging device described in Japanese Patent Laid Open No. 2006-261247, the optical waveguide has a two-layered structure. To perform pupil compensation, the upper optical waveguide portion is biased toward the center of the solid-state imaging device compared with the lower optical wave guide portion. Thus, it is desirable to form the opening of the upper optical waveguide portion so that the opening diameter thereof is larger than that of the lower optical waveguide portion. In this case, among the light rays passed through the upper optical waveguide part, some may not enter the lower optical waveguide portion.

Therefore, it is desirable to provide a solid-state imaging device that obtains a sufficient sensitivity and a sufficient efficiency of photoelectric conversion even if pixels are miniaturized finer. It is also desirable to provide an imaging apparatus equipped with such a solid-state imaging device.

According to a first embodiment of the present invention, a solid-state imaging device includes a light receiving unit formed in each of pixels to perform photoelectric conversion, an optical waveguide buried in an insulating layer located above the light receiving unit and provided for introducing light into the optical waveguide, and an on-chip lens formed above the optical waveguide. The solid-state imaging device further includes a basic cell having two or more pixels that share floating diffusion, and a transistor shared by two or more pixels in the basic cell and arranged on the outside of two or more pixels. In the solid-state imaging device, the light receiving unit is connected to the floating diffusion shared by the pixels in the basic cell through a transfer gate, aid on-chip lenses are arranged substantially at regular intervals. The optical waveguide includes a first optical wave guide and a second optical waveguide. The first optical waveguide is formed so that the position thereof in the surface of the solid-state imaging device is located at a position shifted from the center of the light receiving unit to the transistor and in the inside of the light receiving unit. The second optical waveguide is formed on the upper side of the first optical waveguide so that the position thereof in the surface of the solid-state imaging device is located at a position shifted from the center of the light receiving unit to the transistor and in the inside of the light receiving unit.

According to an embodiment of the present invention, an imaging apparatus includes a converging optical section that collects incident light, a solid-state imaging device that receives incident light collected by the converging optical section and carries out photoelectric conversion of the incident light, and a signal processing section that processes a signal obtained by photoelectric conversion in the solid-state imaging device. In the imaging apparatus of the present embodiment, the solid-state imaging device is configured as a solid-state imaging device according to the embodiment of the present invention.

In the solid-state imaging device according to the embodiment of the present invention, the light receiving unit is connected to the floating diffusion shared by the pixels in the basic cell, and the light receiving unit is connected to the floating diffusion through a transfer gate. The sharing of the transistor and the floating diffusion by two or more pixels leads to an increase in percentage of surface area of the light receiving unit as compared with an unshared case. Thus, the surface area of the light receiving unit per pixel can be extended. A decrease in area of the light receiving unit when miniaturizing the pixel can be reduced. Therefore, it is possible to miniaturize the pixel substantially to the minimum wherever possible, while the dimensions of the optical waveguide are prevented from reaching to the limit of burying property.

According to the present embodiment, on-chip lenses are formed at regular intervals. Thus, so-called invalid zones can be reduced and the generation of loss due to the invalid zone can be prevented.

Furthermore, the second optical waveguide is formed on the upper side of the first optical waveguide so that the position thereof in the surface of the solid-state imaging device is located at a position shifted from the center of the light receiving unit to the transistor and in the inside of the light receiving unit. Therefore, the light collected by the on-chip lens can be fully led to the second optical waveguide and the light passed through the second optical waveguide can be then surely incident on the first optical waveguide.

Furthermore, the first optical waveguide is formed so that the position thereof in the surface of the solid-state imaging device is located at a position shifted from the center of the light receiving unit to the transistor and in the inside of the light receiving unit. Therefore, the light passed through the first optical waveguide can be surely incident on the light receiving unit. In addition, the generation of mixed colors occurred when the light passed through the first optical waveguide enters the light receiving unit of the adjacent pixel can be prevented.

In the imaging apparatus of the present embodiment, the solid-state imaging device is configured as a solid-state imaging device according to the embodiment of the present invention. Therefore, the pixels of the solid-state imaging device can be finely formed and the generation of loss due to the invalid zone can be prevented. In addition, the light passed through the on-chip lens and the optical waveguide can be surely incident on the light receiving unit.

A solid-state imaging device according to an embodiment of the present invention includes a light receiving unit formed in each of pixels to perform photoelectric conversion, an optical waveguide buried in an insulating layer located above the light receiving unit and provided for introducing light into the optical waveguide, and an on-chip lens formed above the optical waveguide. The solid-state imaging device further includes a basic cell having two or more the pixels that share floating diffusion, and a transistor shared by two or more pixels in the basic cell and arranged on the outside of the two or more pixels. The solid-state imaging device further includes the light receiving unit is connected to the floating diffusion shared by the pixels in the basic cell through a transfer gate, the on-chip lenses are arranged substantially at regular intervals. The solid-state imaging device further includes an optical waveguide which is formed so that the position thereof in the surface of the solid-state imaging device is located at a position shifted from the center of the light receiving unit to the transistor and in the inside of the light receiving unit and the inside of the on-chip lens.

According to an embodiment of the present invention, an imaging apparatus includes a converging optical section that collects incident light, a solid-state imaging device that receives incident light collected by the converging optical section and carries out photoelectric conversion of the incident light, and a signal processing section that processes a signal obtained by photoelectric conversion in the solid-state imaging device. In the imaging apparatus of the present embodiment, the solid-state imaging device is configured as a solid-state imaging device according to the embodiment of the present invention.

In the solid-state imaging device according to the embodiment of the present invention, the light receiving unit is connected to the floating diffusion shared by the pixels in the basic cell, and the light receiving unit is connected to the floating diffusion through at transfer gate. The sharing of the transistor and the floating diffusion by two or more pixels leads to an increase in percentage of surface area of the light receiving unit as compared with an unshared case. Thus, the surface area of the light receiving unit per pixel can be extended. A decrease in area of the light receiving unit when miniaturizing the pixel can be reduced. Therefore, it is possible to miniaturize the pixel substantially to the minimum wherever possible, while the dimensions of the optical waveguide are prevented from reaching to the limit of burying property.

In addition, on-chip lenses are formed at regular intervals. Thus, so-called invalid zones can be reduced and the generation of loss due to the invalid zone can be prevented.

Further, the optical waveguide is formed on the upper side of the first optical waveguide so that the position thereof in the surface of the solid-state imaging device is located at a position shifted from the center of the light receiving unit to the transistor and in the inside of the light receiving unit. Thus, the light collected by the on-chip lens can be fully led to the optical waveguide. Therefore, the light passed through the optical waveguide can be surely incident on the light receiving unit.

Furthermore, the generation of mixed colors occurred when the light passed through the optical waveguide enters the light receiving unit of the adjacent pixel can be prevented.

In the imaging apparatus of the present embodiment, the solid-state imaging device is configured as a solid-state imaging device according to the embodiment of the present invention. Therefore, the pixels of the solid-state imaging device can be finely formed and the generation of loss due to the invalid zone can be prevented. In addition, the light passed through the on-chip lens and the optical waveguide can be incident on the light receiving unit.

According to any of the above embodiments, a decrease in area of the light receiving unit when miniaturizing the pixel can be reduced. Therefore, it is possible to miniaturize the pixel to cause an increase in integration of the solid-state imaging device. Also, it is possible to provide the imaging apparatus having the solid-state imaging device with more pixels and miniaturize such an imaging apparatus.

The generation of loss due to the invalid zone can be prevented and the light collected by the on-chip lens can be fully led to the optical waveguide. Thus, the light passed through the second optical waveguide can be surely incident on the light receiving unit.

Therefore, an increase in sensitivity and an increase in efficiency of photoelectric conversion can be attained. According to any of the above embodiment of the present invention, even if pixels are miniaturized, a solid-state imaging device with a sufficient sensitivity and a sufficient efficiency of photoelectric conversion and an imaging apparatus provided with such a soli-state imaging device can be realized.

BRIEF DESCRIPTION OF THE DRAWINGS

FIG. 16 is a diagram that illustrates examples of the cross-sectional profiles of the first optical waveguide and the second optical waveguide, where

FIG. 29 is a diagram that illustrates the results of measuring a change in output due to the incident angle of light, where

FIG. 33 is a diagram that illustrates examples of the cross-sectional profile of the optical waveguide, where

DESCRIPTION OF THE PREFERRED EMBODIMENTS

Hereinafter, the best mode for carrying out the present invention will be described as embodiments thereof. The embodiments will be described in the following order:

1. First embodiment of solid-state imaging device;
2. Second embodiment of solid-state imaging device;
3. Modified embodiment;
4. Third embodiment of solid-state imaging device;
5. Fourth embodiment of solid-state imaging device;
6. Modified embodiment; and
7. Embodiment of imaging apparatus.

1. First Embodiment of Solid-State Imaging Device

Figure 1:
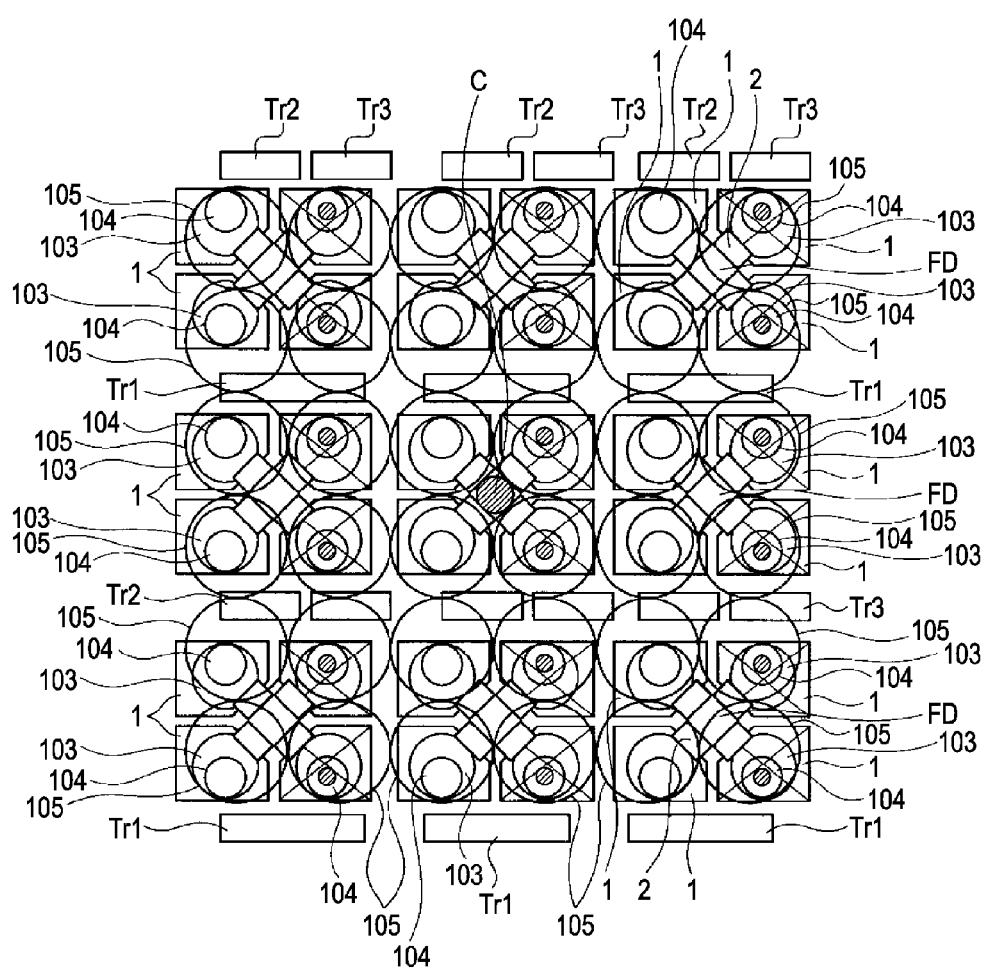
FIG. 1 is a plane diagram that illustrates a schematic configuration of a solid-state imaging device according to a first embodiment of the present invention.

FIG. 1 is a plane diagram that illustrates a schematic configuration of a solid-state imaging device according to a first embodiment of the present invention. As shown in FIG. 1, the solid-state imaging device is constructed of a plurality of pixels arranged in matrix form, a rectangular array of pixels in columns and rows. For instance, FIG. 1 illustrates 36 pixels (6 pixels per column×6 pixels per row) that surround the center C of the imaging device.

Hereinafter, reference numeral 1 denotes a light receiving unit and 2 denotes a transfer gate. Also, reference numeral 103 denotes a first optical waveguide, 104 denotes a second optical waveguide, and 105 denotes an on-chip lens. Reference numeral 10 denotes a semiconductor substrate, 11 denotes a charge accumulation layer, 12 denotes a positive charge accumulation region, 13 denotes a gate insulating film, and 14 denotes a gate electrode. Furthermore, reference numeral 18, 23, and 28 denote barrier metal layers, 19, 24, and 29 denote conductive layers. Reference numeral 20 denotes a first diffusion preventing film, 32 and 37 denote buried layers, 36 denotes a passivation film, 38 denotes a planarizing resin layer, and 39 denotes a color filter. Reference numeral 100 denotes a signal line and 110 denotes a wiring line. Reference numeral 500 denotes an imaging apparatus, 501 denotes an imaging unit, 502 denotes an optical system, and 503 denotes a signal processor. In the figure, "FD" represents a floating diffusion, "RST" represents a reset transistor, "Amp" represents an amplification transistor, and "SEL" represents a selection transistor.

Each pixel has a photodiode that includes a light receiving unit 1, a first optical waveguide 103, a second optical waveguide 104, and an on-chip lens 105. The light receiving unit 1 performs photoelectric conversion of the received light. The first optical waveguide 103 and the second optical waveguide 104 introduce the incident light into the light receiving unit 1. The on-chip lens 105 converges the incident light. Each of the first and second optical waveguides 103 and 104 has a circular cross-sectional shape. The first optical waveguide 103 is located on the lower side as a lower layer (on the side of the light receiving unit 1). The second optical waveguide 104 is located on the upper side as an upper layer (on the side of the on-chip lens 105). The opening diameter of the upper layer, the second optical waveguide 104, is smaller than that of the lower layer, the first optical waveguide 103.

Four pixels in total, two in column×two in row, share a floating diffusion FD that can accumulate electric charges produced by optical conversion. In each of the four pixels, a transfer gate 2 is formed between the light receiving unit 1 and the floating diffusion FD shared by four pixels.

In addition, transistors Tr1, Tr2, and Tr3 are arranged on the upper and lower sides of the four pixels with the shared floating diffusion FD. The exemplary configurations of the respective transistors Tr1, Tr2, and Tr3 include, but not particularly limited to, an amplification transistor, a reset transistor, and a selection transistor.

Figure 2:
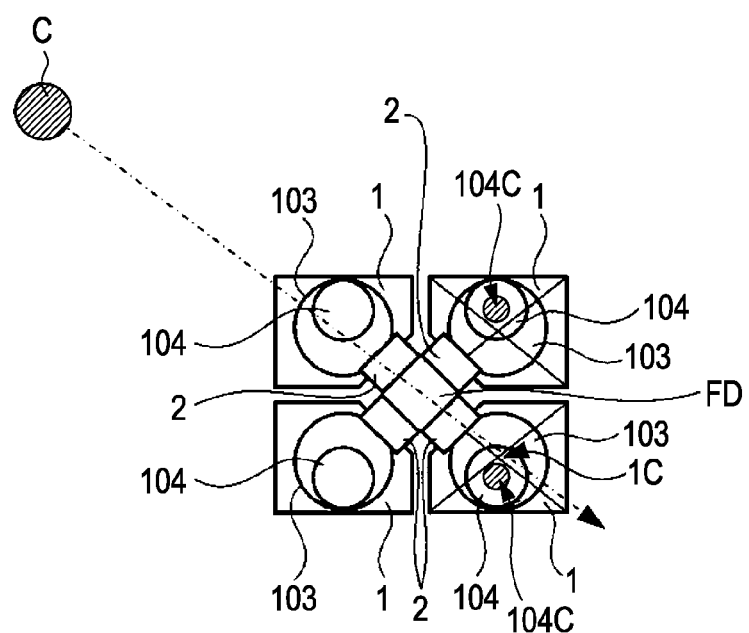
FIG. 2 is a plane diagram that illustrates a basic cell with four pixels in the solid-state imaging device shown in FIG. 1.

FIG. 2 illustrates four pixels located on the lower right side of FIG. 1.

In the solid-state imaging device of the present embodiment, the four pixels that share the floating diffusion FD is provided as a basic cell. In FIG. 2, the basic cell on the lower right side of FIG. 1 and the center C of the imaging device are illustrated.

As shown in FIG. 2, in each of the four pixels, both the center (not shown) of the first optical waveguide 103 and the center 104C of the second optical waveguide 104 are shifted from the center C of the light receiving unit 1.

Specifically, in two upper pixels in the figure, both the center (not shown) of the first optical waveguide 103 and the center 104C of the second optical waveguide 104 are shifted upward from the center 1C of the light receiving unit 1. In two lower pixels in the figure, both the center (not shown) of the first optical waveguide 103 and the center 104C of the second optical waveguide 104 are shifted downward from the center 1C of the light receiving unit 1. Here, consideration is given to a line drawn from the center C of the imaging device to the center 1C of the light receiving unit 1 of each pixel. In the case of the two upper pixels, the distance from the center C of the imaging device to both the center of the first optical waveguide 103 and the center 104C of the second optical waveguide 104 is shorter than the distance from the center 1C of the light receiving unit 1. In contrast, in the case of the two lower pixels, the distance from the center C of the imaging device to both the center of the first optical waveguide 103 and the center 104C of the second optical waveguide 104 is longer than the distance from the center 1C of the light receiving unit 1. In other words, the basic cell includes a mixture of two different kinds of pixels, those in which the distance from the center C of the imaging device to both the center of the first optical waveguide 103 and the center 104C of the second optical waveguide 104 is shorter than the distance from the center 1C of the light receiving unit 1 and others in which the distance is longer.

Referring back to FIG. 1, the plane view of the entire pixel, it is also found mixed two different kinds of pixels, those in which the distance from the center C of the imaging device to both the center of the first optical waveguide 103 and the center 104C of the second optical waveguide 104 is shorter than the distance from the center 1C of the light receiving unit 1 and others in which the distance is longer. The pixels, in which the distance from the center C of the imaging device to both the center of the first optical waveguide 103 and the center 104C of the second optical waveguide 104 is shorter than the distance from the center 1C of the light receiving unit 1, are pixels on the second row from the upper side and pixels on the second row from the lower side of the figure. In pixels on the remaining four rows, the distance from the center C of the imaging device to both the center of the first optical waveguide 103 and the center 104C of the second optical waveguide 104 is longer than the distance from the center 1C of the light receiving unit 1.

In the imaging device described in Japanese Patent Laid Open No. 2006-261247, on the other hand, all of the pixels are those in which the distance from the center C of the imaging device to both the center of the first optical waveguide 103 and the center 104C of the second optical waveguide 104 is equal to or shorter than the distance from the center 1C of the light receiving unit 1. Besides, there is no pixel in which the distance from the center C of the imaging device to both the center of the first optical waveguide 103 and the center 104C of the second optical waveguide 104 is longer than the distance from the center 1C of the light receiving unit 1. In this regard, the configuration of the imaging device of the present embodiment completely differs from the typical imaging device.

Figure 3:
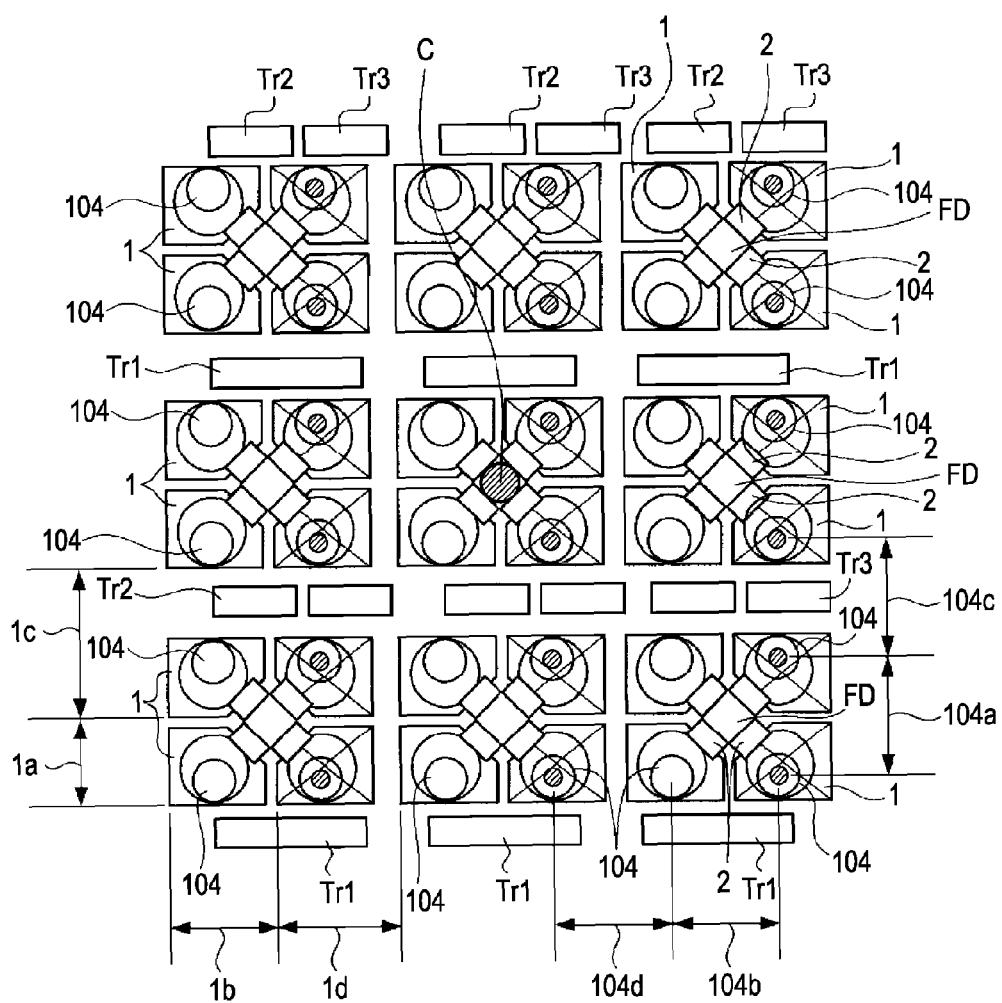
FIG. 3 is a diagram that illustrates some of structural components shown in FIG. 1, such as first optical waveguides, second optical waveguides, light receiving units, and transistors.
Figure 4:
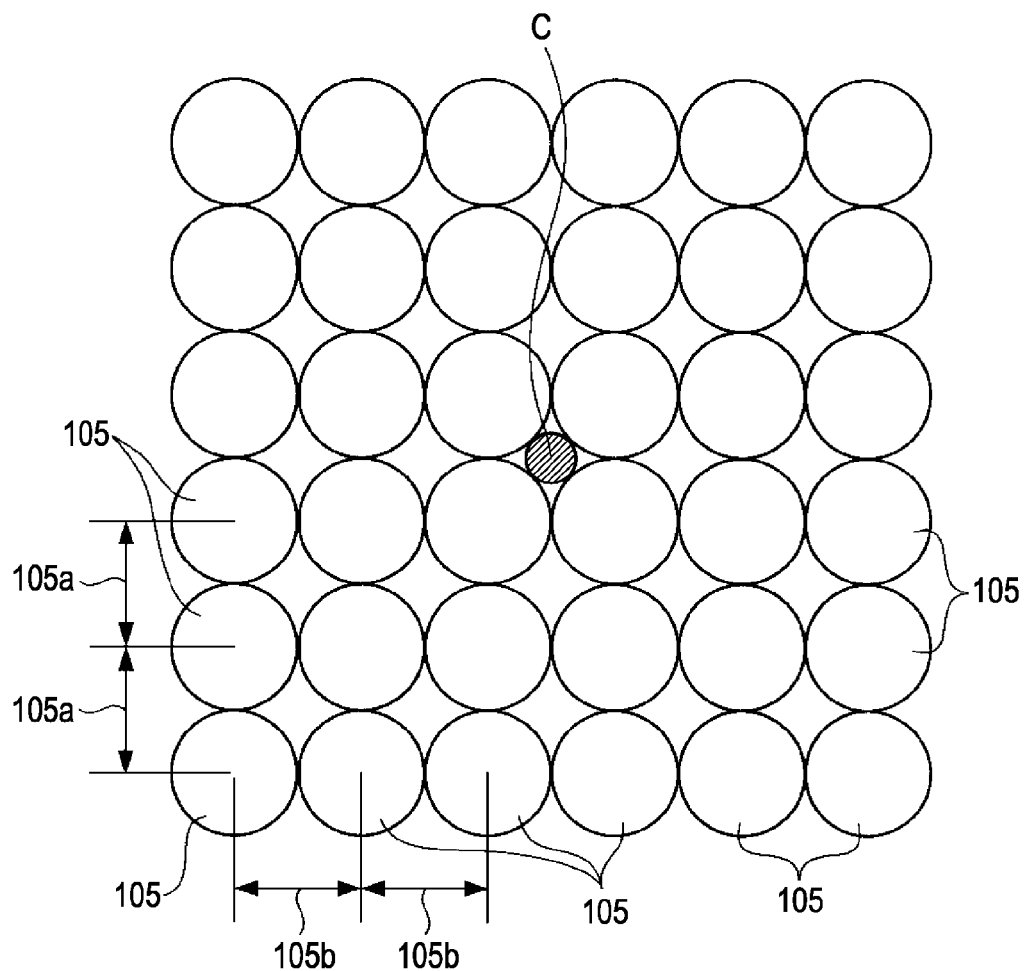
FIG. 4 is a diagram that illustrates on-chip lenses among structural components shown in FIG. 1.
Figure 5:
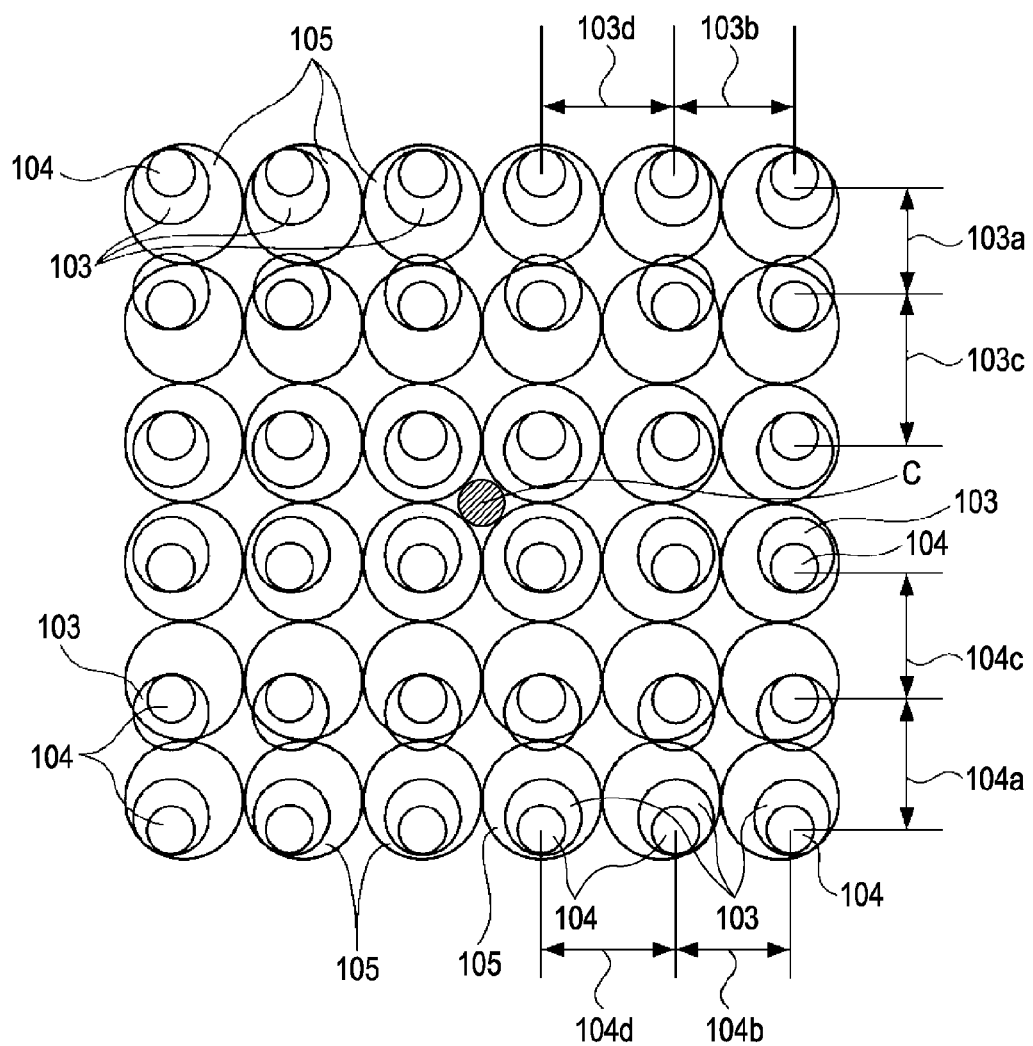
FIG. 5 is a diagram that illustrates on-chip lenses, first optical waveguides, and second optical waveguides among structural components shown in FIG. 1.

Each of FIG. 3 to FIG. 5 is a plane view of some components of the solid-state imaging device shown in FIG. 1. Specifically, FIG. 3 illustrates the first optical waveguides 103, the second optical waveguides 104, the light receiving units 1, the transistors Tr1, Tr2, and Tr3, and so on. FIG. 4 represents only the on-chip lenses 105. FIG. 5 represents the on-chip lenses 105, the first optical waveguides 103, and the second optical waveguides 104. In FIG. 3 to FIG. 5, the center C of the imaging device is also represented together with these components.

As shown in FIG. 3, the light receiving units 1 of the respective pixels are regularly arranged so that four pixels form a basic cell.

Four pixels of the basic cell are concentrically located around the shared floating diffusion FD.

On the other hand, the upper two pixels of the pixels and the lower two pixels are spaced from each other and sandwich the transistors Tr1, Tr2, and Tr3. In addition, the space between the pixels is changed every other row. In other words, in the row direction, the distance 1c between the pixels of the adjacent basic cells through the transistor is larger than the distance 1a between the pixels in the same basic cell.

Also, in the column direction, the distance between the pixels of the adjacent basic cells is larger than the distance of the pixels in the same basic cell. Furthermore, the distance between the pixels is changed every other column. That is, the distance 1d between the pixels of the adjacent basic cells is larger than the pixels of the same basic cells.

Hereinafter, the distance between the first optical waveguides 103 of the same basic cell in the column direction is defined as a waveguide distance 103a. The distance between the first optical waveguides 103 of the adjacent basic cells in the column direction is defined as a waveguide distance 103c. In the row direction, the distance between the first optical wave guides 103 of the same basic cell is defined as a waveguide distance 103b and that of the adjacent basic cells is defined as a waveguide distance 103d. Similarly, the distance between the second optical wave guides 104 of the same basic cell in the column direction is defined as a waveguide distance 104a. The distance between the second optical wave guides 104 of the adjacent basic cells in the column direction is defined as a waveguide distance 104c. In the row direction, the distance between the second optical wave guides 104 of the same basic cell is defined as a waveguide distance 104b and that of the adjacent basic cells is defined as a waveguide distance 104d.

In the column direction, the distance between the first optical waveguides 103 is changed every other row. In other words, the distance 103a between the first optical waveguides 103 of the same basic cell is different from the distance 103c between the first optical waveguides 103 of the adjacent basic cells that sandwich the transistor. In addition, the distance between the first optical waveguides 103 in the row direction is slightly changed every other column. In the row direction, the distance 103b between the first optical waveguides 103 of the same basic cell is different from the distance 103d between the first optical waveguides 103 of the adjacent basic cells that sandwich the transistor.

In contrast, the second optical wave guides 104 are arranged at a substantially equal distance in the column direction. That is, in the column direction, the distance 104a between the second optical waveguides 104 in the same basic cell is almost equal to the distance 104c between the second optical waveguides 104 in the adjacent basic cells that sandwich the transistor. In addition, the distance between the second optical waveguides 104 in the row direction is slightly changed every other column. In the row direction, the distance 104b between the second optical waveguides 104 of the same basic cell is slightly different from the distance 104d between the first optical waveguides 104 of the adjacent basic cells that sandwich the transistor. Furthermore, in each of the pixels, the planar configurations of the first and second optical waveguides 103 and 104 are included in the inside of the light receiving unit 1.

Moreover, the second optical conductor 104 on the upper side is included in the first optical conductor 103 on the lower side in the same plane.

As shown in FIG. 4, the on-chip lenses 105 are arranged substantially at regular intervals in the column and row directions. That is, in the column direction, the distance between the on-chip lenses 105 of the same basic cell is substantially equal to the distance between the lenses 105 of the adjacent basic cells that sandwich the transistor. Thus, these distances are represented by the same reference numeral 105a. In addition, in the row direction, the distance between the on-chip lenses 105 of the same basic cell is substantially equal to the distance between the lenses 105 of the adjacent basic cells that sandwich the transistor. Thus, these distances are represented by the same reference numeral 105b.

If the distances among the on-chip lens 105 are unequal, a region without converged incident light, or an invalid zone, becomes extended in a portion with a relatively wide distance between the on-chip lenses when the on-chip lenses of the respective pixels are prepared in the same diameter and the same curvature.

As shown in FIG. 5, a relative position between the first and second optical waveguides 103 and 104 and the on-chip lens 105 varies depending on the position of the pixel.

In each of the pixels of two rows on the upper side, viewing from the center C of the imaging device, the first optical waveguide 103 is shifted to the upper portion of the on-chip lens 105 and the second optical waveguide 104 is located on the upper half of the on-chip lens 105. In each of the pixels of two rows on the opposite sides of the center C of the imaging device, both the first optical waveguide 103 and the second optical waveguide 104 are located near the center of the on-chip lens 105 in the column direction.

In each of the pixels of two rows on the lower side, viewing from the center C of the imaging device, the first optical waveguide 103 is shifted to the lower portion of the on-chip lens 105 and the second optical waveguide 104 is located on the lower half of the on-chip lens 105.

In each of the pixels of two columns on the right side, viewing from the center C of the imaging device, the first optical waveguide 103 is shifted to the right portion of the on-chip lens 105 and the second optical waveguide 104 is located on the right half of the on-chip lens 105.

In each of the pixels of two columns on the opposite sides of the center C of the imaging device, both the first optical waveguide 103 and the second optical waveguide 104 are located near the center of the on-chip lens 105 in the row direction. In each of the pixels of two columns on the left side, viewing from the center C of the imaging device, the first optical waveguide 103 is shifted to the right portion of the on-chip lens 105 and the second optical waveguide 104 is located on the left half of the on-chip lens 105.

Furthermore, in each of the pixels, the planar configuration of the second optical waveguide 104 is included in the inside of the light receiving unit 1.

On the other hand, some of the first optical waveguides 103 of the respective pixels are partially out of the corresponding on-chip lenses 105.

In this first embodiment, a relative position between the on-chip lens 105 and the light receiving unit 1 varies depending on the position of the pixel viewing from the center of the imaging device. In addition, the on-chip lens 105 is shifted from the center 1C of the light receiving unit to the center C of the imaging device depending on the distance from the center C of the imaging device to the pixel.

That is, the on-chip lens 105 has been processed by pupil correction. Here, the term "pupil correction" means that the waveguide is shifted to an appropriate position with respect to the on-chip lens or the light reception unit to take measures against a fact that the incident light is not vertically incident on the periphery of a pixel but obliquely incident thereon. On the other hand, both the first optical waveguide 103 and the second optical waveguide 104 have not been processed by pupil correction.

Furthermore, the distances among the components are as follows: In the case of two pixels on the upper and lower sides of the same basic cell, the distance 103a between the optical waveguides is longer than the distance 1a between the pixels. In the case of two pixels on the right and left sides of the same basic pixel, the distance 103b between the optical waveguides is slightly longer than the distance 1a between the pixels.

The distance 1a between two pixels on the upper and lower sides of the same basic pixel is different from the distance 1c between the pixels of the adjacent basic cells that sandwich the transistor.

The waveguide distance 103a and the waveguide distance 103c are substantially equal to each other. Furthermore, even though it is preferable that the waveguide distance 103a and the waveguide distance 103c are equal to each other, the waveguide distance 103a and the waveguide distance 103c may be unequal to each other.

If the distances between the optical waveguides are arranged at regular intervals, an increase in incident-angle dependency of the optical waveguide 103 in the row direction occurs and the optical properties of causing some phenomena, such as horizontal stripes and shading, can be improved.

The waveguide distance 103b and the waveguide distance 103d are slightly different from each other. The waveguide distance 103d is slightly larger than each of the waveguide distances 103b and 103d. It is preferable that the waveguide distance 103b is equal to the waveguide distance 3d, but not limited to be equal.

As compared with the distance 1b between two pixels on the right and left sides of the same basic cell, the distance 1 between pixels of the adjacent basic cells in the row direction is slightly longer. By the way, the distance 1b between the pixels and the distance 1d between the pixels may be substantially equal.

The difference between the waveguide difference 103b and the waveguide difference 103d are substantially equal to the difference between the pixel distance 1b and the pixel distance 1d. Thus, the center of the first optical waveguide 3 is located near the center 1C of the light receiving unit 1.

In the case of two pixels on the upper and lower sides of the same basic cell, the distance 104a between the optical waveguides is longer than the distance 1a between the pixels.

Here, the waveguide distance 104a may be equal to or larger than the pixel distance 1a.

The waveguide distance 104c is larger than the waveguide distance 104a.

The waveguide distance 104b and the waveguide distance 104d are slightly different from each other. The waveguide distance 104d is slightly larger.

The sum of the pixel distance 1a and the pixel distance 1c is equal to the sum of the waveguide distance 103a and the waveguide distance 103c and also equal to the sum of the waveguide distance 104a and the waveguide distance 104c. These sums are equivalent to pitches of the basic cells in the column direction.

The sum of the pixel distance 1b and the pixel distance 1d is equal to the sum of the waveguide distance 103b and the waveguide distance 103d and also equal to the sum of the waveguide distance 104b and the waveguide distance 14d. These sums are equivalent to pitches of the basic cells in the row direction.

The cross-sectional configuration of each pixel is not specifically limited as far as it includes the light receiving unit 1, the first optical waveguide 10, the second optical waveguide 104, and the on-chip lens 105.

Figure 6:
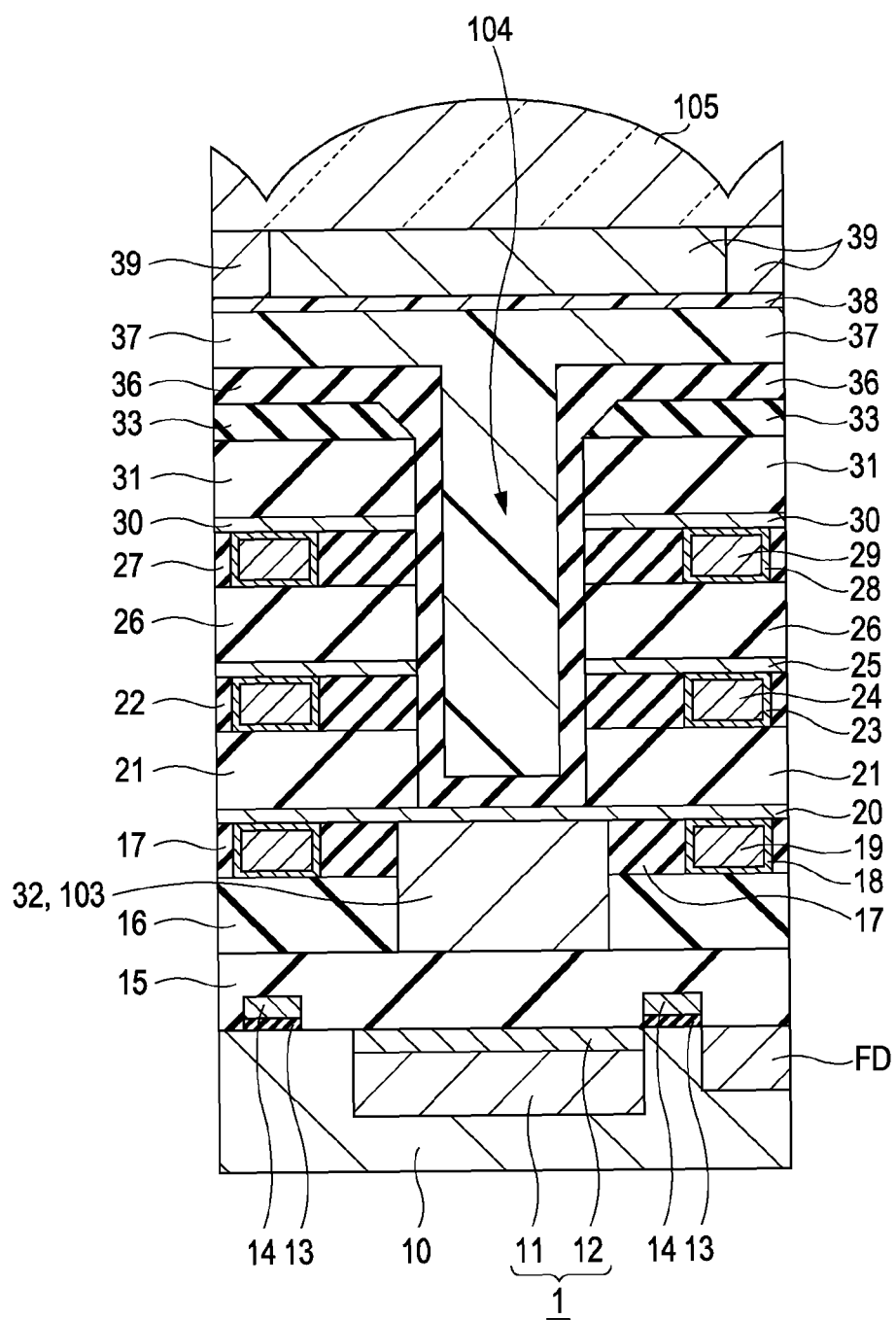
FIG. 6 is a cross-sectional view of a pixel in a solid-state imaging device shown FIG. 1.

FIG. 6 is a cross-sectional view of an exemplary configuration of a pixel of the solid-state imaging device shown in FIG. 1.

As shown in FIG. 6, the light receiving unit 1 is constructed by forming an n-type charge accumulation layer 11 on a p-well region or the like of a semiconductor substrate 10 and forming a p+-type positive charge accumulation layer 12 on the surface of the n-type charge accumulation layer 11.

Furthermore, a gate insulating film 13 and a gate electrode 14 are formed on the semiconductor substrate 10 while being adjacent to the right side of the light receiving unit 1. The gate electrode 14 is a transfer gate 2 in FIG. 1. A floating diffusion FD is formed in the semiconductor substrate 10 while being adjacent to the right side of the gage electrode 14. In the cross-section (not shown) of the semiconductor substrate 10, source/drain regions of the transistors Tr1, Tr2, and Tr3 are formed. The application of a voltage to the gate electrode 14 leads to transfer of signal charges from the light receiving unit 1 to the floating diffusion FD.

Insulating films made of silicon oxide or the like are laminated on the semiconductor substrate 10 while covering the light receiving unit 1. The insulating films include a first insulating film 15, a second insulating film 16, a third insulating film 17, a fourth insulating film 21, a fifth insulating film 22, a sixth insulating film 26, a seventh insulating film 27, and an eighth insulating film 31. In addition, a first diffusion preventing film 20 and a second diffusion preventing film 25, which are made of silicon carbide or the like, and a third diffusion preventing film 30, which is made of silicon nitride or the like, are laminated among the insulating films, respectively. The lamination of these insulating films and diffusion preventing films makes an insulating layer as a whole.

A wiring groove is formed in the third insulating film 17 and a first wiring layer constructed of a barrier metal layer 18 and a conductive layer 19 is then buried in the wiring groove. Likewise, a wiring groove is formed in the fifth insulating film 22 and a second wiring layer constructed of a barrier metal layer 23 and a conductive layer 24 is then buried in the wiring groove. Likewise, a wiring groove is formed in the seventh insulating film 27 and a second wiring layer constructed of a barrier metal layer 28 and a conductive layer 29 is then buried in the wiring groove. Each of the barrier metal layers 18, 23, and 28 may be, for example, a stacked film of tantalum/tantalum nitride. Each of the conductive layers 19, 24, and 29 may be any of various metallic materials for wiring lines, such as copper. The above first to third diffusion preventing films are provided for preventing the metal such as copper of the conductive layers 19, 24, and 29 from being dispersed.

A ninth insulating film 33 made of silicon oxide is formed on the eighth insulating film 31.

Furthermore, a buried layer 32 is buried in the second insulating film 16 and the third insulating film 17 above the light receiving unit 1 so that it passes through these films 16 and 17. The buried layer 32 has a refractive index higher than that of the silicon oxide (refractive index 1.45) of the insulating film. The buried layer 32 forms a first optical waveguide 103 on the lower side.

Furthermore, a depressed portion is formed above the light receiving unit 1 so that it passes through the fourth to ninth insulating films 21 to 33 and the second and third diffusion preventing films 25 and 30, which are laminated as described above. The first diffusion preventing film 20 is formed on the bottom of the depressed portion.

The inner wall surface of the depressed portion is perpendicular to the principal plane of the substrate. Part of the ninth insulating film 33 is provided as an edge of the depressed portion and forms an opening that broadens out upwardly in a forward tapered shape.

A passivation film 36 is formed so that it covers the inner wall surface of the depressed portion. In addition, for example, a buried layer 37 is formed on the passivation film 36 and buried in the depressed portion. The buried layer 37 has a refractive index higher than that of the silicon oxide (refractive index 1.45) of the insulating film.

The buried layer 37 completely fills the inside of the depressed portion.

Each of the buried layer 32 and the buried layer 37 may be made of resin with a high refractive index, such as siloxane resin (refractive index 1.7) or polyimide. To increase the refractive index, these resin materials may contain any of metal oxide particulates including those of titanium oxide, tantalum oxide, niobium oxide, tungstic oxide, zirconium dioxide, zinc oxide, indium oxide, and hafnium oxide. As long as it can be buried in the inside of the depressed portion, any inorganic material with a high refractive index may be used.

The buried layer 32 and the buried layer 37 may be made of different materials, respectively.

The passivation film 36 may be made of a material with a refractive index equal to or near that of silicon oxide used for the insulating film or a material with a refractive index higher than that of the silicon oxide. Examples of the materials with higher refractive indexes include silicon nitride and silicon oxynitride (SiON).

If the passivation film 36 is made of a material with a refractive index equal to or near that of silicon oxide used for the insulating film, the buried layer 37 in the inside of the depressed portion serves as the second optical waveguide 104 on the upper side.

If the passivation film 36 is made of a material with a refractive index higher than that of silicon oxide used for the insulating film, the second optical waveguide 104 on the upper side is constructed of the passivation film 36 and the buried layer 37 in the inside of the depressed portion.

A planarizing resin layer 38, which can be also functioned as a bonding layer, is formed on the buried layer 37. Thus, for example, each pixel is provided with one of blue (B), green (G), and red (R) color filters 39. Furthermore, an on-chip lens 105 is formed on the color filter 39.

As is evident from FIG. 6, the width of the first optical waveguide 103 is slightly smaller than that of the light receiving unit 1. In addition, the first optical waveguide 103 is formed such that the position thereof in the surface of the solid-state imaging device can be located within the position of the light receiving unit 1 in the surface of the solid-state imaging device.

In addition, the width of the second optical waveguide 104 is slightly smaller than the width of the light receiving unit 1 and the width of the first optical waveguide 103. In addition, the second optical waveguide 105 is formed such that the position thereof in the surface of the solid-state imaging device can be located within the position in the surface of the solid-state imaging device of each of the light receiving unit 1, the first optical waveguide 103, and the on-chip lens 105.

On the basis of the pixel structure shown in FIG. 6, a pixel is formed such that the position in the surface of the solid-state imaging device of each of the light receiving unit 1, the first optical waveguide 103, the second optical waveguide 104, and the on-chip lens 105 is shifted with respect to the position of the pixel from the center C of the imaging device.

For instance, the solid-state imaging device with the cross-sectional structure of the pixel shown in FIG. 6 can be manufactured as follows:

An n-type charge accumulation layer 11 is formed on a p-well region or the like of a semiconductor substrate 10 and a p+-type positive charge accumulation layer 12 is then formed on the surface of the n-type charge accumulation layer 11 to provide a light receiving unit 1. In addition, a gate insulating film 13 and a gate electrode 14 are formed on the semiconductor substrate 10 while being adjacent to the light receiving unit 1. Furthermore, a floating diffusion FD as well as source/drain regions of the transistors Tr1, Tr2, and Tr3 are formed in the semiconductor substrate 10.

Next, for example, the light receiving unit 1 is covered with silicon oxide deposited on the entire surface of the light receiving unit 1 by a chemical vapor deposition (CVD) method or the like to form a first insulating film 15. Subsequently, for example, silicon oxide is deposited on the first insulating film 15 to form a second insulating film 16 and silicon oxide is further deposited thereon to form a third insulating film 17.

Next, for example, the third insulating film 17 is subjected to etching processing to form a wiring line groove. The inner wall of the wiring groove is covered with, for example, tantalum/tantalum oxide by sputtering to form a barrier metal layer 18.

After that, a copper seed layer is formed and subjected to electrolytic plating to form a copper film on the entire surface of the followed structure. Then, the resulting film is subjected to chemical mechanical polish (CMP) or the like to remove the copper form on the outside of the wiring groove, thereby forming a conductive layer 19.

Moreover, a barrier metal layer 18 is formed on the surface of the conductive layer 19 and the portion thereof formed on the outside of the wiring groove is then removed. In FIG. 6, the barrier metal layer 18 is also formed on the surface of the conductive layer 19. However, if it is not desired to form the barrier metal layer 18 on the surface of the conductive layer 19, this step is omitted.

Thus, a first wiring layer constructed of the barrier metal layer 18 and the conductive layer 19, which are buried in the wiring groove, is formed.

Subsequently, both the second insulating film 16 and the third insulating film 17 are etched to form an opening that passes through these films 16 and 17.

Then, for example, a film is formed with siloxane resin containing metal oxide particulates of titanium oxide or the like by a spin coat method at a deposition temperature of about 400° C. to fill in the hole. Thus, a buried layer 32 with a refractive index higher than that of silicon oxide is formed. After the application of the resin, for example, post-bake processing is performed at a temperature of about 300° C. if desired. In the case of polyamide resin, for example, the film formation may be performed at a temperature of about 350° C.

Next, for example, silicon carbide is deposited on the first wiring layer by the CVD method or the like to form a first diffusion preventing film 20.

Subsequently, the same procedures as those used for the formation of the second insulating film 16, the third insulating film 17 and the wiring groove thereof, the first wiring layer constructed of the barrier metal layer 18 and the conductive layer 19, and the first diffusion preventing film 20. Consequently, the procedures form a fourth insulating layer 21, a fifth insulating layer 22 and the wiring groove thereof, a second wiring layer constructed of a barrier metal layer 24 and a conductive layer 24, a second diffusion preventing film 25, a sixth insulating film 26, a seventh insulating film 27 and the wiring groove thereof, and a third wiring layer constructed of a barrier metal layer 28 and a conductive layer 29. Furthermore, for example, silicon nitride is deposited by the CVD method to form a third diffusion preventing film 30. Next, an eighth insulating film 31 is formed on the third diffusion preventing film 30.

After that, for example, silicon oxide is deposited on the entire surface of the eighth insulating film 31 to form a ninth insulating film 33.

Subsequently, for example, a resist film is subjected to the pattern formation of the opening of a depressed portion by a photolithography process, followed by being subjected to isotropic etching or anisotropic etching. As a result, an opening that broadens out upwardly in a forward tapered shape is formed in the ninth insulating film 33.

Next, the resist film is removed and, for example, a second resist film is then patterned with the same pattern as that of the first resist film. The patterned second resist film is subjected to anisotropic etching, such as reactive ion etching, to form a depressed portion passing through the fourth to ninth insulating films 21 to 33, the second diffusion preventing film 25, and the third diffusion preventing film 30. During the formation of such a depressed portion, for example, the etching is proceeded while the conditions thereof are changed depending on the materials of silicon nitride, silicon carbonide, and so on as well as silicon oxide. The etching is promptly stopped when the bottom of the opening reaches to the first diffusion preventing film 20. As a result, the first diffusion preventing film 20 serves as the bottom of a depressed portion. Thus, the constant depth of the depressed portion leads to the constant distance between the light receiving unit 1 and the second optical waveguide 4.

In this way, part of the ninth insulating film 33 is provided as an edge of the depressed portion and forms an opening in a forward tapered shape.

Next, for example, silicon nitride or silicon oxynitride (SiON) with a refractive index higher than that of silicon oxide is deposited on the inner wall of the depressed portion by a plasma CVD method at a deposition temperature of about 380° C. to form a passivation film 36.

As the edge of the opening is formed in a forward tapered shape, the profile of the passivation film 36 is formed so that, due to the anisotropy of the deposition, it is formed thicker at the edge of the opening and thinner at the bottom proximity of the depressed portion.

Next, for example, the passivation film 36 is coated with siloxane resin containing metal oxide particulates, such as titanium oxide, by a spin coat method at a deposition temperature of about 400° C. Thus, a buried layer 37 with a refractive index higher than silicon oxide is placed on the top of the passivation film 36 and buried in the depressed portion.

After the application of the resin, for example, post-bake processing is performed at a temperature of about 300° C. if desired. In the case of polyamide resin, for example, the film formation may be performed at a temperature of about 350° C.

Next, for example, a planarizing resin layer 38 is formed on the top of the buried layer 37. The planarizing resin layer 38 can be also functioned as a bonding layer. On the top of the planarizing resin layer 38, for example, a color filter 39 of each of blue (B), green (G), and red (R) is provided for every pixel. Subsequently, an on-chip lens 5 is formed on the top of the color filter 39.

In the manufacturing method described above, hydrogen disposal (sintering) may be performed for terminating the dangling bond in the semiconductor after the step of forming the third wiring layer but before the step of forming the buried layer.

Therefore, the solid-state imaging device with the cross-sectional structure of the pixel shown in FIG. 6 can be manufactured.

Figures 7, 8:
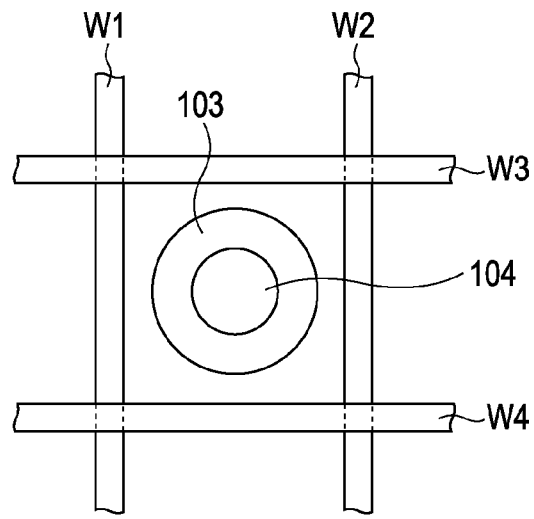
FIG. 7 is a schematic diagram that illustrates a planar layout of the pixel.
FIG. 8 is a diagram that illustrates an exemplary arrangement of colors of the respective color filters with respect to 36 pixels shown in each of FIG. 1 and FIG. 22.

Then, the planar layout of the pixel is schematically illustrated in FIG. 7.

In this figure, a first optical waveguide 103 is circular in cross section in which a second optical waveguide 104 with a circular cross section is formed. The wiring layers, such as the first to third wiring layers in FIG. 6, are formed so that they are arranged like a mesh structure to surround the optical waveguide 103 in the insulating films. The term "mesh structure" means that, for example, the wiring layers and the insulating films are alternately stacked in the column direction.

For instance, in FIG. 7, both the first optical waveguide 103 and the second optical waveguide 104 are arranged in an area surrounded by the wiring layers W1 and W2 extending in the column direction and the wiring layers W3 and W4 extending in the horizontal direction. The wiring layers W1, W2, W3, and W4 may have their own mesh structures.

Although the light receiving unit 1 is not represented in FIG. 7, the light receiving unit 1 is formed more outside from the first optical waveguide 103. For example, in the case of the cross-sectional structure shown in FIG. 6, the outer edge of the light receiving unit 1 is located near the locations of the wiring layers W1, W2, W3, and W4.

Referring now to FIG. 8, an exemplary arrangement of color filter colors on 36 pixels shown in FIG. 1 will be described.

In the arrangement of colors shown in FIG. 8, one red (R), one blue (B), and two green (G: Gb and Gr) color filters are assigned to each of four pixel of every basic cell. Then, the green (Gb) and the green (Gr) are assigned to the pixels that face to each other through the floating diffusion DF. Also, the red (R) and the blue (B) are assigned to the pixels that face to each other through the floating diffusion DF.

Figure 9:
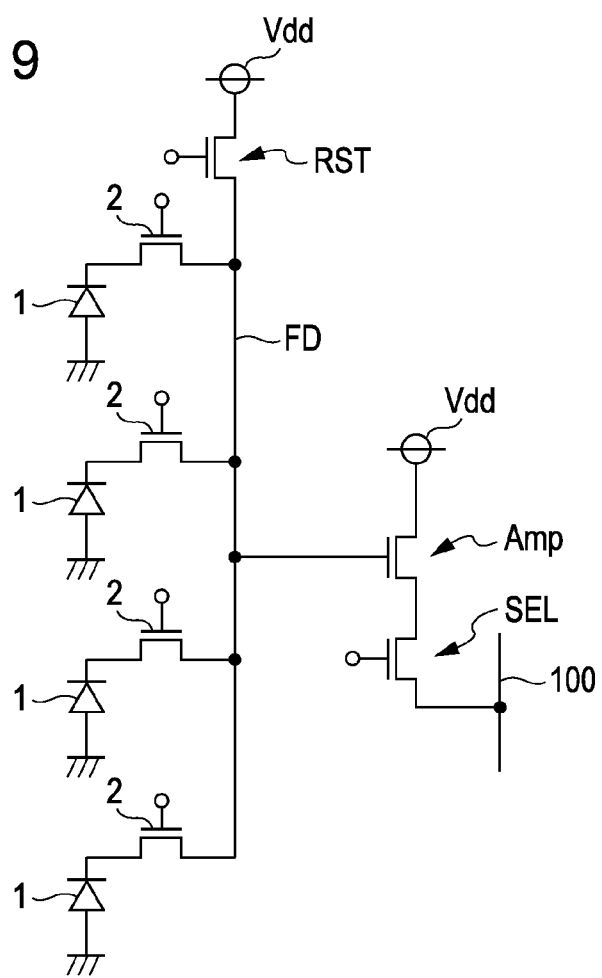
FIG. 9 is a diagram that illustrates an exemplary equivalent circuit of four pixels of a basic cell in the solid-state imaging device shown in each of FIG. 1 and FIG. 22.

FIG. 9 is a diagram illustrating an exemplary equivalent circuit of four pixels of a basic cell in the solid-state imaging device according to the first embodiment of the present invention.

As shown in FIG. 9, the light receiving unit 1 constructed of four photodiodes are connected to the common floating diffusion FD through the transfer gate 2. In addition, the floating diffusion FD is connected to one of source/drain regions of a reset transistor RST and the gate of an amplification transistor Amp.

One of the source/drain regions of the amplification transistor is connected to one of the source/drain regions of a selection transistor SEL. The other of the source/drain regions of the reset transistor RST and the other of the source/drain regions of the amplification transistor Amp are connected to a power supply potential Vdd. The other of the source/drain regions of the selection transistor SEL is connected to a signal line 100. In other words, the part on the side of three transistors RST, Amp, and SEL from the floating fusion FD has the same configuration as that of a typical pixel having four transistors (including the transfer transistor of the transistor gate).

Figure 10:
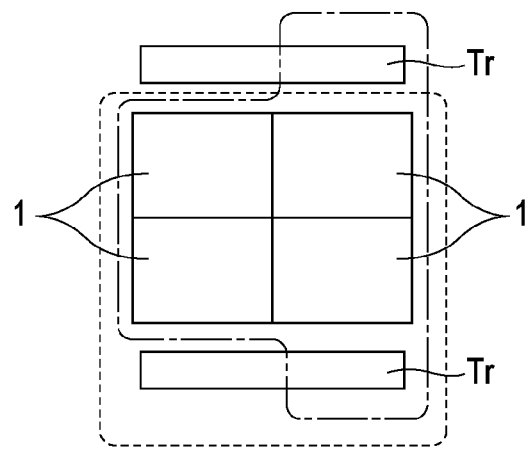
FIG. 10 is a diagram that illustrates a positional relationship between transistors used by four pixels of the basic cell shown in each of FIGS. 1, 12, 22, and 30.

Referring now to FIG. 10, two examples in which the circuit configuration shown in FIG. 9 is realized will be described.

FIG. 10 is a diagram illustrating a positional relationship between transistors used by four pixels of a basic cell. The strip-shaped transistors Tr are arranged on the upper and lower sides of the basic cell with four pixels, respectively.

In a first example, as represented by the chain line in FIG. 10, the right half of the upper transistor Tr and the right half of the lower transistor Tr are used. The left halves of the respective transistors are used by four pixels of each of the basic cells located above and below the transistors.

In a second example, as represented by the dashed line in FIG. 10, the whole lower transistor is used.

The upper transistor is used by four pixels of the basic cell located above the transistor.

Figure 11A:
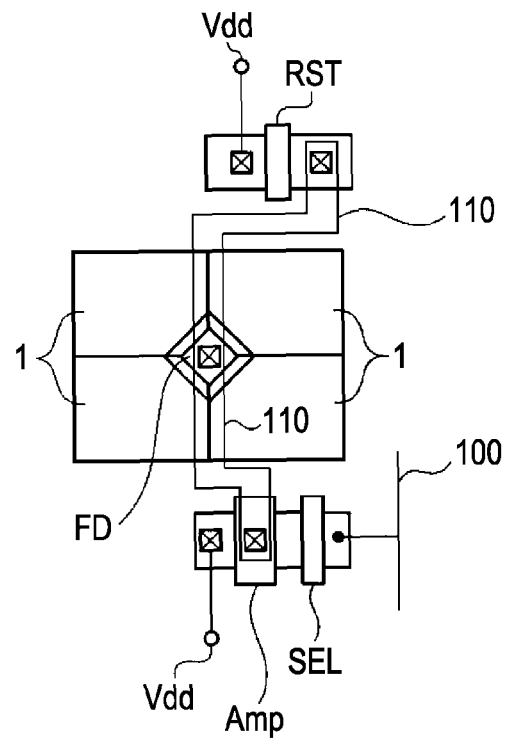
FIG. 11A is a diagram that illustrates a first example of the configuration of a wiring line shown in each of FIGS. 1, 12, 22, and 30.

An example of wiring in the first example is illustrated in FIG. 11A. The reset transistor RST is formed on the right half of the upper transistor Tr. In contrast, the amplification transistor Amp and the selection transistor SEL are formed on the right half of the lower transistor Tr. A wiring line 100 is formed so that it longitudinally extends from the lower side to the upper side to connect the floating diffusion FD to one of the source/drain region of the reset transistor RST and the gate of the amplification transistor Amp.

Figure 11B:
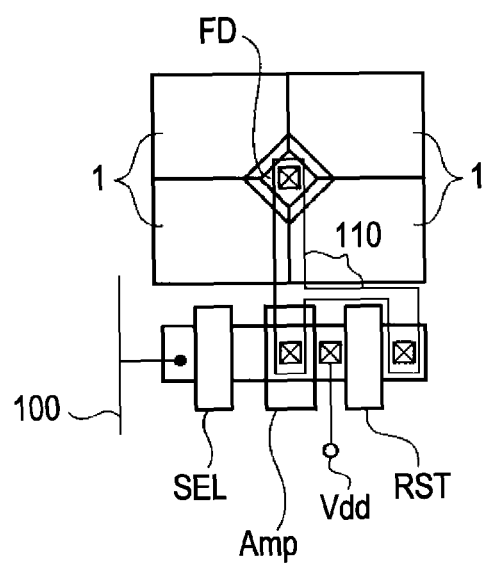
FIG. 11B is a diagram that illustrates a second example of the configuration of a wiring line shown in each of FIGS. 1, 12, 22, and 30.

An example of wiring in the second example is illustrated in FIG. 11B. The reset transistor RST is formed on the right half of the lower transistor Tr. The amplification transistor Amp is formed on the middle of the lower transistor Tr. The selection transistor SEL is formed on the left half of the lower transistor Tr. The floating diffusion FD and the gate of amplification transistor Amp are connected by a wiring line 110 which is longitudinally extended on the lower side. The wiring line 110 branches to the right from a halfway point thereof and is then connected to one of the source/drain regions of the reset transistor RST.

According to the above embodiment, four pixels of the basic cell share the floating diffusion FD and the transistors Tr1, Tr2, and Tr3. Therefore, as compared with a case in which floating diffusion FD and transistors Tr1, Tr2, and Tr3 are not shared, the percentage of the surface area of the light receiving unit 1 to the surface area of the pixel can be increased, or the surface area of the light receiving unit 1 can be extended. A decrease in area of the light receiving unit 1 when miniaturizing the pixel can be reduced. Therefore, it is possible to miniaturize the pixel substantially to the minimum wherever possible, while the dimensions of the first and second optical waveguides 103 and 104 are prevented from becoming a limit of burying property.

Therefore, it is possible to miniaturize the pixel to cause an increase in integration of the solid-state imaging device. Also, it is possible to provide the imaging apparatus having the solid-state imaging device with more pixels and miniaturize such an imaging device.

According to the present embodiment, on-chip lenses 5 are formed at regular intervals. Thus, so-called invalid zones can be reduced and the generation of loss due to the invalid zone can be prevented.

In addition, the planer position of the second optical waveguide 104 is formed so that it can be shifted from the center 1C of the light receiving unit 1 to the transistors Tr1, Tr2, and Tr3. Besides, it is also formed so that it can be included in the inside of the first optical waveguide 103 as well as the inside of the on-chip lens 105. Therefore, the light collected by the on-chip lens 105 can be fully led to the second optical waveguide 104 and the light passed through the second optical waveguide 104 can be then surely incident on the first optical waveguide 103. In this way, the position of the second optical waveguide 104 in the surface of the solid-state imaging device is included in the inside of the first optical waveguide 3. Thus, the light which does not enter the lower optical waveguide in the configuration of the device described in Japanese Patent Laid Open No. 2006-261247.

Furthermore, the planer position of the first optical waveguide 103 is formed so that it can be shifted from the center 1C of the light receiving unit 1 to the transistors Tr1, Tr2, and Tr3. Besides, it is also formed so that it can be included in the inside of the first optical waveguide 103 of the light receiving unit 1.

Therefore, the light passed through the first optical waveguide 104 can be surely incident on the light receiving unit 1. In addition, the generation of mixed colors occurred when the light passed through the first optical waveguide 103 enters the light receiving unit 1 of the adjacent pixel can be prevented.

Therefore, an increase in sensitivity and an increase in efficiency of photoelectric conversion can be attained. Thus, even if pixels are miniaturized, a solid-state imaging device with a sufficient sensitivity and a sufficient efficiency of photoelectric conversion can be realized. Also, an imaging apparatus provided with such a soli-state imaging device can be realized.

According to the present embodiment, furthermore, the imaging device is provided with a two-layered optical waveguide, the first optical waveguide 103 and the second optical waveguide 104. Thus, as compared with the device provided with an upper optical waveguide, the color mixtures and the loss can be prevented. The amount of shift from the center 1C of the light receiving unit 1 can be shared. Thus, flexibility in designing the optical waveguide can be extended. In addition, it is also possible to cope with a comparatively large amount of shift of the on-chip lens 105 from the light-receiving unit 1.

According to the present invention, furthermore, the second optical waveguides 104 are arranged at almost regular intervals, so that the optical properties of causing some phenomena, such as horizontal stripes, irregular color, and shading, can be improved.

In the first embodiment, the components are arranged so that the more the distance from the center C of the imaging device increases outwardly, the more the distance from the center of the on-chip lens 5 to each of the centers of the first and second optical waveguides 103 and 104 increases. The imaging device having such a configuration is preferably used for a camera with a short-focus optical lens (e.g., a cellular phone camera).

In the above description, the exemplary solid-state imaging device according to the first embodiment of the present invention includes 36 pixels as shown in FIG. 1. However, the present embodiment is not limited to such a configuration of the solid-state imaging device. In practice, the solid-state imaging device may include tens of thousands or more of pixels.

For example, accumulated three-million pixels can be obtained by accumulating 750,000 basic cells (four pixels per cell).

In the above description, the first embodiment of the present invention is applied to the color solid-state imaging device using color filters as shown in FIG. 6 or FIG. 8.

According to the first embodiment of the present invention, the solid-state imaging device is not limited to one using color filters. Alternatively, the first embodiment may be applied to a monochrome solid-state imaging device, an infrared photo detecting solid-state imaging device, or a solid-state imaging device having some pixels provided for infrared photo detection without color filters.

2. Solid-State Imaging Device of Second Embodiment

Figure 12:
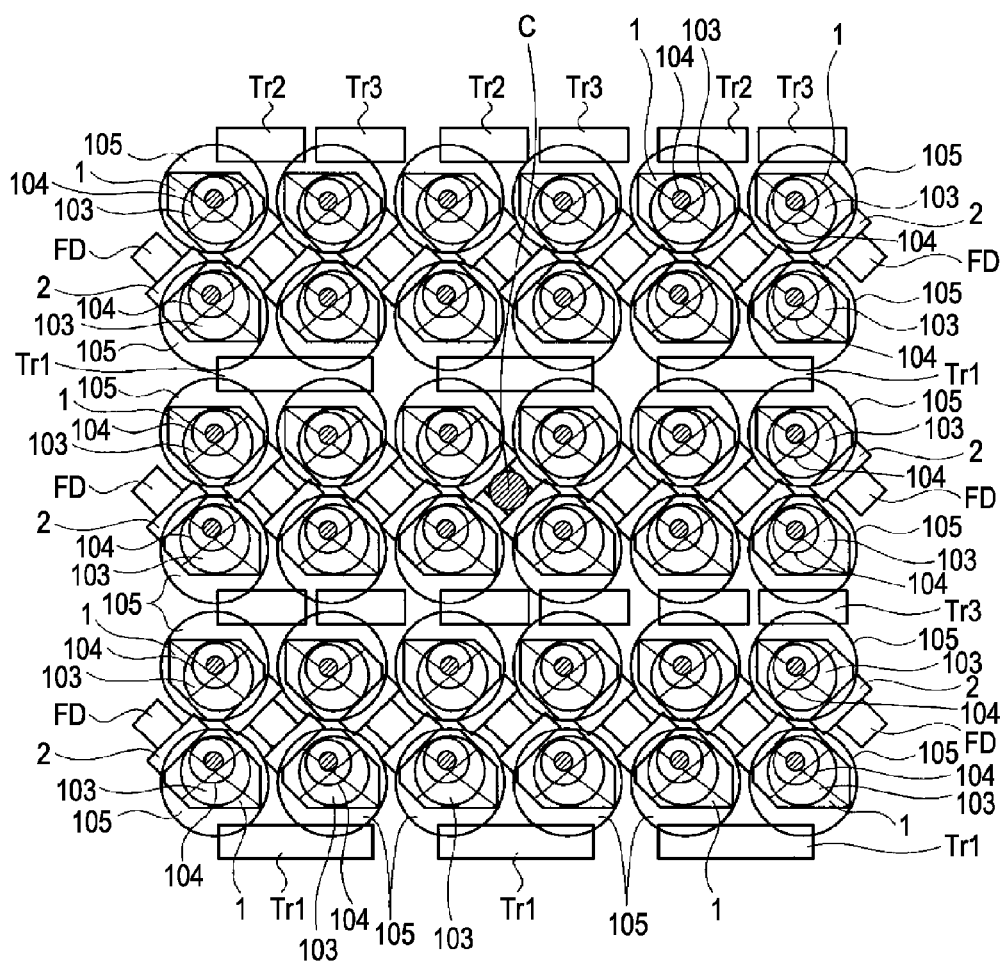
FIG. 12 is a plane diagram that illustrates a schematic configuration of a solid-state imaging device according to a second embodiment of the present invention.

FIG. 12 is a plane diagram that illustrates a schematic configuration of a solid-state imaging device according to a second embodiment of the present invention.

As shown in FIG. 12, the solid-state imaging device is constructed of a plurality of pixels arranged in matrix form, a rectangular array of pixels in rows and columns. For instance, FIG. 12 illustrates 36 pixels (6 pixels per row×6 pixels per column) that surround the center C of the imaging device.

Each pixel has a photodiode that includes a light receiving unit 1, a first optical waveguide 103 and a second optical waveguide 104, and an on-chip lens 105. The light receiving unit 1 performs photoelectric conversion of the received light. The first optical waveguide 103 and the second optical waveguide 104 introduce the incident light into the light receiving unit 1. The on-chip lens 105 converges the incident light. The first optical waveguide 103 and the second optical waveguide 104 are arranged so that the first optical waveguide 103 is located on the under side as a lower layer (on the side of the light receiving unit 1). The second optical waveguide 104 is located on the upper side as an upper layer (on the side of the on-chip lens 105). The opening diameter of the upper layer, the second optical waveguide 104, is smaller than that of the lower layer, the first optical waveguide 103.

In addition, two pixels aligned in an oblique direction, one on the upper left side and the other on the lower right side, share a floating diffusion FD. In each of the two pixels, a transfer gate 2 is formed between the light receiving unit 1 and the floating diffusion FD shared by two pixels.

In addition, transistors Tr1, Tr2, and Tr3 are arranged on the upper and lower sides of four pixels, two in the column direction and two in the row direction. The exemplary configurations of the respective transistors Tr1, Tr2, and Tr3 include, but not particularly limited to, an amplification transistor, a reset transistor, and a selection transistor.

Figure 13:
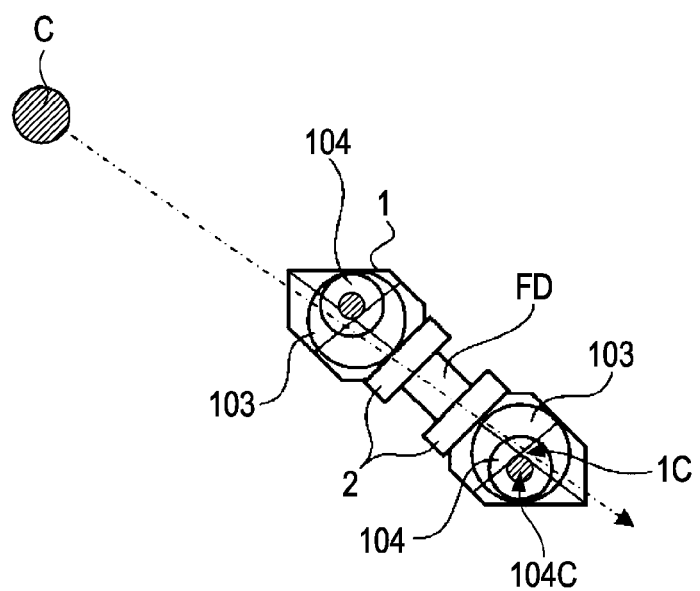
FIG. 13 is a plane diagram that illustrates a basic cell with two pixels in the solid-state imaging device shown in FIG. 12.

Here, among four pixels on the lower right side of FIG. 12, FIG. 13 illustrates two pixels that share the floating diffusion FD.

In the solid-state imaging device of the present embodiment, the two pixels that share the floating diffusion FD is provided as a basic cell. In FIG. 13, the basic cell on the lower right side of FIG. 12 and the center C of the imaging device are illustrated.

As shown in FIG. 13, in each of the two pixels, both the center (not shown) of the first optical waveguide 103 and the center 104C of the second optical waveguide 104 are shifted from the center C of the light receiving unit 1. Specifically, in the upper left pixel in the figure, both the center (not shown) of the first optical waveguide and the center 104C of the second optical waveguide are shifted upward from the center 1C of the light receiving unit 1. In the lower right pixel in the figure, both the center (not shown) of the first optical waveguide and the center 104C of the second optical waveguide are shifted downward from the center 1C of the light receiving unit 1.

Here, consideration is given to a line drawn from the center C of the imaging device to the center 1C of the light receiving unit 1 of each pixel. In the case of the upper left pixel, the distance from the center C of the imaging device to both the center of the first optical waveguide 103 and the center 104C of the second optical waveguide 104 is shorter than the distance from the center 1C of the light receiving unit 1. In contrast, in the case of the lower right pixel, the distance from the center C of the imaging device to both the center of the first optical waveguide 103 and the center 104C of the second optical waveguide 104 is longer than the distance from the center 1C of the light receiving unit 1. In other words, the basic cell includes a mixture of two different kinds of pixels, those in which the distance from the center C of the imaging device to both the center of the first optical waveguide 103 and the center 104C of the second optical waveguide 104 is shorter than the distance from the center 1C of the light receiving unit 1 and others in which the distance is longer.

Referring back to FIG. 12, the plane view of the entire pixel, it is also found mixed two different kinds of pixels, those in which the distance from the center C of the imaging device to both the center of the first optical waveguide 103 and the center 104C of the second optical waveguide 104 is shorter than the distance from the center 1C of the light receiving unit 1 and others in which the distance is longer. The pixels, in which the distance from the center C of the imaging device to both the center of the first optical waveguide 103 and the center 104C of the second optical waveguide 104 is shorter than the distance from the center 1C of the light receiving unit 1, are pixels on the second row from the upper side and pixels on the second row from the lower side of the figure. In pixels on the remaining four rows, the distance from the center C of the imaging device to both the center of the first optical waveguide 103 and the center 104C of the second optical waveguide 104 is longer than the distance from the center 1C of the light receiving unit 1. This feature is the same as that of the first embodiment of FIG. 1.

Figure 14:
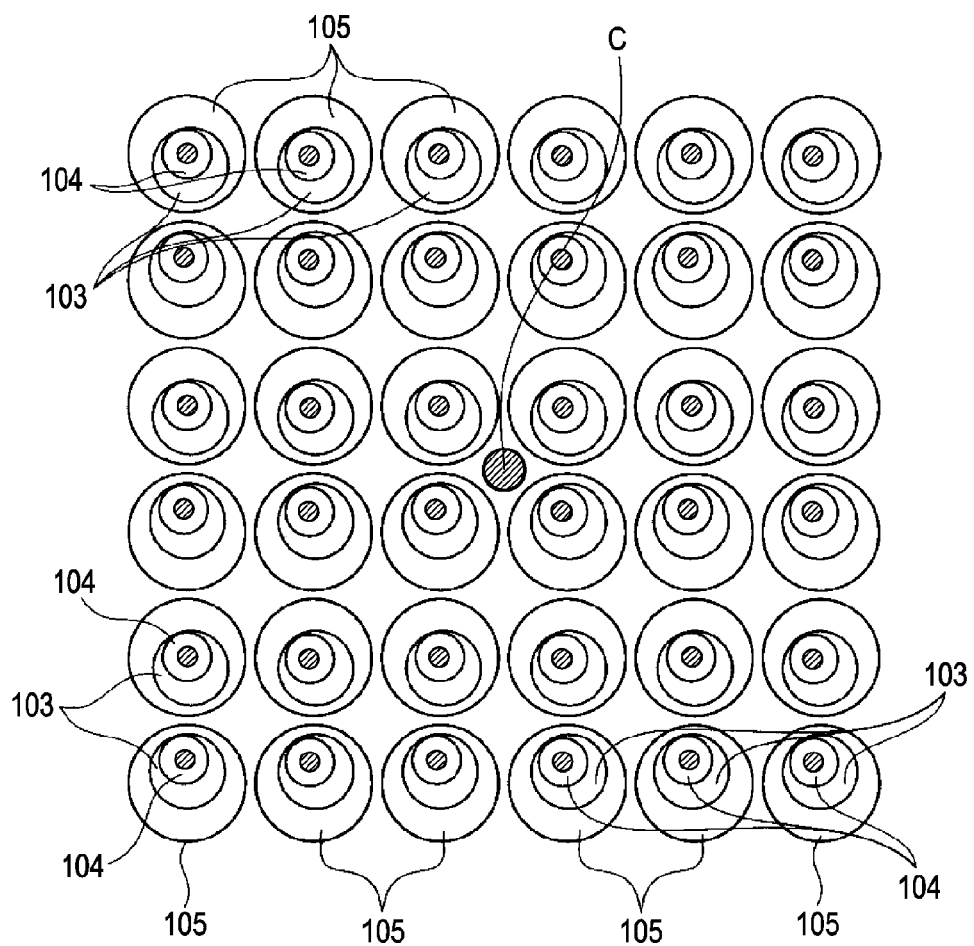
FIG. 14 is a diagram that illustrates on-chip lenses, first optical waveguides, and second optical waveguides among structural components shown in FIG. 12.

FIG. 14 represents the on-chip lenses 105, the first optical waveguides 103, and the second optical waveguides 104 shown in FIG. 12.

In FIG. 14, the center C of the imaging device is also represented together with these components. As shown in FIG. 14, a relative position between the second optical waveguide 104 and the on-chip lens 105 is substantially constant without depending on the position of the pixel. In this regard, the configuration of the imaging device of the second embodiment differs from that of the first embodiment. Here, a relative position between the first optical waveguide 103 and 104 and the on-chip lens 105 depending on the position of the pixel.

In each pixel, the second optical waveguide 104 is located near the center of the on-chip lens 105.

As shown in FIG. 14, both the second optical waveguide 104 and the on-chip lens 105 are arranged at an equal distance from one another in the column and row directions. Furthermore, in each of the pixels, the planar configuration of the second optical waveguide 104 is included in the inside of the light receiving unit 1.

Furthermore, the planar configuration of the first optical waveguide 103 is almost included in the inside of the on-chip lens 105.

In this second embodiment, a relative position between the on-chip lens 105 and the light receiving unit 1 is slightly shifted. The amount of the shift does not correspond to the distance from the center C of the imaging device. In other words, the on-chip lens 105 has not been processed by pupil correction. In addition, both the first optical waveguide 103 and the second optical waveguide 104 have not been processed by pupil correction.

In this second embodiment, the cross-sectional configuration of each pixel is not specifically limited as far as it includes the light receiving unit 1, the first optical waveguide 10, the second optical waveguide 104, and the on-chip lens 105.

For example, the cross-sectional structure shown in FIG. 6 and the planar layout shown in FIG. 7 can be used.

Figure 15:
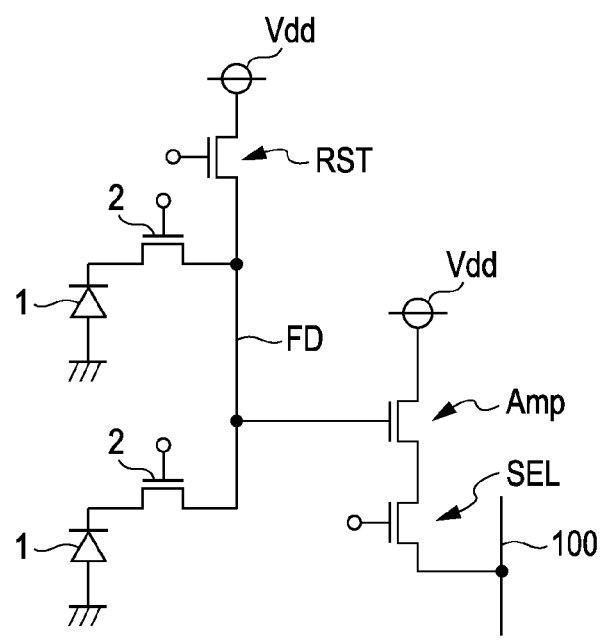
FIG. 15 is a diagram that illustrates an exemplary equivalent circuit of two pixels of a basic cell in the solid-state imaging device shown in FIG. 12.

FIG. 15 is a diagram illustrating an exemplary equivalent circuit of two pixels of a basic cell in the solid-state imaging device according to the second embodiment of the present invention.

As shown in FIG. 15, the light receiving unit 1 constructed of four photodiodes are connected to the common floating diffusion FD through the transfer gate 2. In addition, the floating diffusion FD is connected to one of source/drain regions of a reset transistor RST and the gate of an amplification transistor Amp. One of the source/drain regions of the amplification transistor is connected to one of the source/drain regions of a selection transistor SEL. The other of the source/drain regions of the reset transistor RST and the other of the source/drain regions of the amplification transistor Amp are connected to a power supply potential Vdd. The other of the source/drain regions of the selection transistor SEL is connected to a signal line 100. In other words, the part on the side of three transistors RST, Amp, and SEL from the floating fusion FD has the same configuration as that of a typical pixel having four transistors (including the transfer transistor of the transistor gate).

Here, in the second embodiment, the same components as those in the above first embodiment are assigned the same reference numerals to omit duplicated descriptions thereof.

According to the above embodiment, two pixels of the basic cell share the floating diffusion FD and the transistors Tr1, Tr2, and Tr3. Therefore, as compared with a case in which floating diffusion FD and transistors Tr1, Tr2, and Tr3 are not shared, the percentage of the surface area of the light receiving unit 1 to the surface area of the pixel can be increased, or the surface area of the light receiving unit 1 can be extended. A decrease in area of the light receiving unit 1 when miniaturizing the pixel can be reduced. Therefore, it is possible to miniaturize the pixel substantially to the minimum wherever possible, while the dimensions of the first and second optical waveguides 103 and 104 are prevented from becoming a limit of burying property.

Therefore, it is possible to miniaturize the pixel to cause an increase in integration of the solid-state imaging device. Also, it is possible to provide the imaging apparatus having the solid-state imaging device with more pixels and miniaturize such an imaging device.

According to the present embodiment, on-chip lenses 105 are formed at regular intervals. Thus, so-called invalid zones can be reduced and the generation of loss due to the invalid zone can be prevented.

In addition, the planer position of the second optical waveguide 104 is formed so that it can be shifted from the center 1C of the light receiving unit 1 to the transistors Tr1, Tr2, and Tr3. Besides, it is also formed so that it can be included in the inside of the first optical waveguide 103 as well as the inside of the on-chip lens 105. Therefore, the light collected by the on-chip lens 105 can be fully led to the second optical waveguide 104 and the light passed through the second optical waveguide 104 can be then surely incident on the first optical waveguide 103. In this way, the position of the second optical waveguide 104 in the surface of the solid-state imaging device is included in the inside of the first optical waveguide 103. Thus, the light which does not enter the lower optical waveguide in the configuration of the device described in Japanese Patent Laid Open No. 2006-261247.

In addition, the planer position of the first optical waveguide 103 is formed so that it can be shifted from the center 1C of the light receiving unit 1 to the transistors Tr1, Tr2, and Tr3. Besides, it is also formed so that it can be included in the inside of the first optical waveguide 103 of the light receiving unit 1. Therefore, the light passed through the first optical waveguide 104 can be surely incident on the light receiving unit 1. In addition, the generation of mixed colors occurred when the light passed through the first optical waveguide 103 enters the light receiving unit 1 of the adjacent pixel can be prevented.

Therefore, an increase in sensitivity and an increase in efficiency of photoelectric conversion can be attained. Thus, even if pixels are miniaturized, a solid-state imaging device with a sufficient sensitivity and a sufficient efficiency of photoelectric conversion and an imaging apparatus provided with such a soli-state imaging device can be realized.

According to the present embodiment, furthermore, the imaging device is provided with a two-layered optical waveguide, the first optical waveguide 103 and the second optical waveguide 104. Thus, as compared with the device provided with an upper optical waveguide, the color mixtures and the loss can be prevented. The amount of shift from the center 1C of the light receiving unit 1 can be shared. Thus, flexibility in designing the optical waveguide can be extended. In addition, it is also possible to cope with a comparatively large amount of shift of the on-chip lens 105 from the light-receiving unit 1.

According to the present invention, furthermore, the second optical waveguides 104 are arranged at almost regular intervals, so that the optical properties of causing some phenomena, such as horizontal stripes, irregular color, and shading, can be improved.

In this second embodiment, the center of the second optical waveguide 104 and the center of the on-chip lens 105 are substantially coincident with each other. Thus, the light can be efficiently collected and electric charges can be efficiently obtained. The imaging device having such a configuration is preferably used for a camera with a plural-focus optical lens (e.g., a zoom lens).

In the above description, the exemplary solid-state imaging device according to the second embodiment of the present invention includes 36 pixels as shown in FIG. 12. However, the present embodiment is not limited to such a configuration of the solid-state imaging device. In practice, the solid-state imaging device may include tens of thousands or more of pixels.

For example, accumulated eight-million pixels can be obtained by accumulating four-million basic cells (two pixels per cell).

According to any of the above embodiments, two or four pixels of the basic cell share the floating diffusion FD and transistors.

In the solid-state imaging device of the present embodiment, the number of pixels of the basic cell, which share the floating diffusion FD, is not specifically limited as long as two or more pixels are included.

Furthermore, if the wiring lines and pixels are arranged in the column and row directions, the layout of pixels can be easily performed when the number of pixels of the basic cell is even.

In each of the above embodiments, the first optical waveguide 103 and the second optical waveguide 104 are shifted from the center 1C of the light receiving unit 1 to the upper or lower side where the transistors Tr1, Tr2, and Tr3 are located. In contrast, the first optical waveguide 103 and the second optical waveguide 104 are slightly shifted or not shifted from the center 1C of the light receiving unit 1 in the column direction. In other words, the first optical waveguide 103 and the second optical waveguide 104 have not been processed by pupil correction.

Here, the imaging device according to any of the above embodiments may be designed so that the first optical waveguide 103 and/or the second optical waveguide 104 are shifted from the center 1C of the light receiving unit 1 in the row direction. For example, in consideration of pupil correction, the first optical waveguide 103 and the second optical waveguide 104 are shifted to the left on the right half of the pixel and to the right on the left half thereof. The amount of the shift may be changed depending on the distance from the center C of the imaging device.

In this embodiment, therefore, the solid-state imaging device may be designed for not only performing pupil correction on the on-chip lens but also performing pupil correction on the optical waveguide.

3. Modified Embodiment

Hereinafter, modified embodiments of the solid-state imaging device of the first and second embodiment will be described.

First, several examples of the cross-sectional profiles of the first optical waveguide 103 and the second optical waveguide 104 are illustrated in FIG. 16.

Figure 16A:
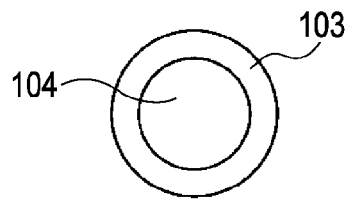
FIGS. 16A to 16D illustrates different examples.

FIG. 16A is a circular optical waveguide like the one shown in FIG. 7.

Figure 16B:
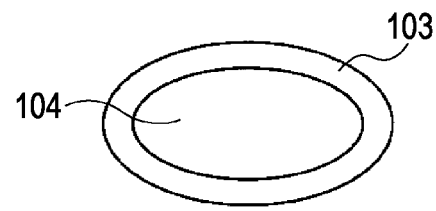

FIG. 16B shows an elliptical optical waveguide.

Figure 16C:
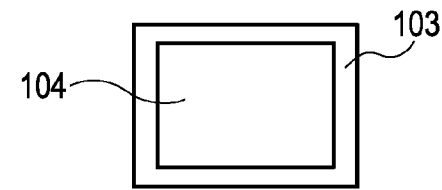

FIG. 16C shows a rectangular (square-shaped) optical waveguide.

Figure 16D:
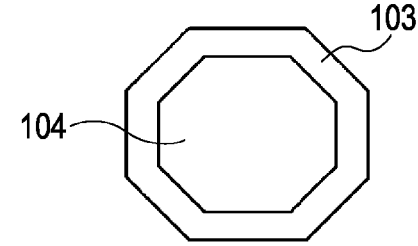

FIG. 16D shows an octagonal optical waveguide.

Solid-state imaging devices having optical waveguides with these different cross-sectional profiles were actually manufactured. Regardless of their cross-sectional profiles, it is found that they can act as solid-state imaging devices without any problem. Obviously, other cross-sectional profiles may be applied to the first and second optical waveguides 103 and 104.

Preferably, the cross-sectional profiles of the first and second optical waveguides may be outwardly convexed. It means that a depressed portion and a buried layer for such first and second optical waveguides can be stably formed.

Figure 17:
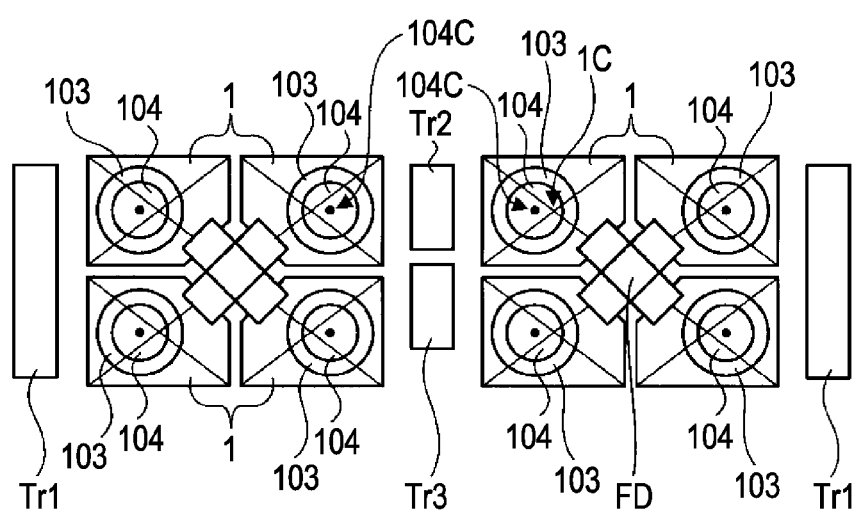
FIG. 17 is a diagram that illustrates the arrangements of transistors, light receiving units, first optical waveguides, and second optical waveguides of a first modified embodiment.
Figure 18:
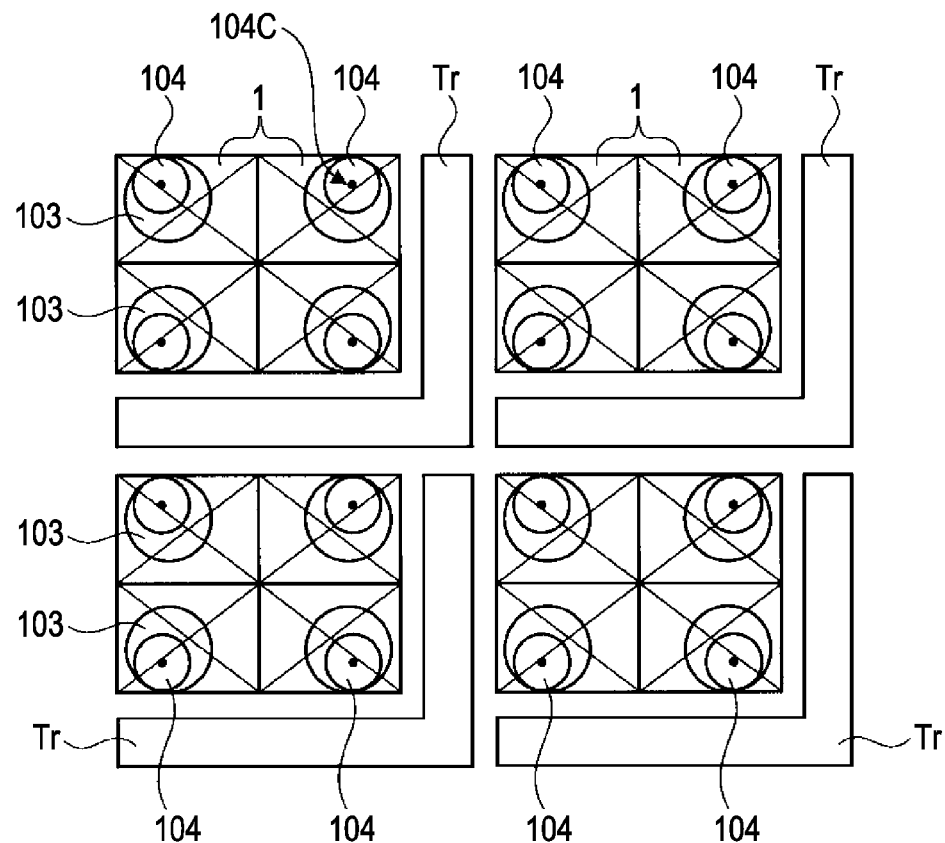
FIG. 18 is a diagram that illustrates the arrangements of transistors, light receiving units, first optical waveguides, and second optical waveguides of a second modified embodiment.
Figure 19:
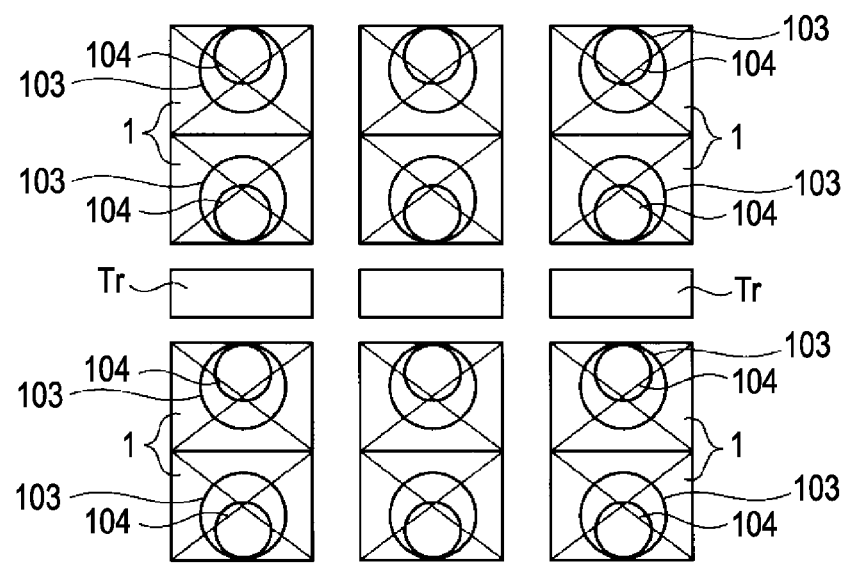
FIG. 19 is a diagram that illustrates the arrangements of transistors, light receiving units, first optical waveguides, and second optical waveguides of a third modified embodiment.

Referring now to FIG. 17 to FIG. 19, exemplary arrangements of transistors and the first and exemplary arrangements of the first and second optical waveguides 103 and 104 on the light receiving unit 1 will be described. For the sake of simplification, floating diffusion is not illustrated in FIG. 17 to FIG. 19.

In the first modified embodiment shown in FIG. 17, additional transistors Tr are arranged on the right and left sides of the basic cell with four pixels that share the floating fusion.

In two pixels on the left side of the basic cell, the first and second optical waveguides 103 and 104 are shifted from the center of the light receiving unit 1 to the left. In two pixels on the right side of the basic cell, the first and second optical waveguides 103 and 104 are shifted from the center of the light receiving unit 1 to the right.

In the second modified embodiment shown in FIG. 18, transistors Tr are arranged on the right and lower sides of the basic cell with four pixels that share the floating fusion. In this case, in the basic cells on the second or later row from the upper side, transistors Tr are arranged on the left, right, upper and lower sides of the respective basic cells.

In the pixel on the upper left of the basic cell, both the first optical waveguide 103 and the second optical waveguide 104 are shifted from the center of the light receiving unit 1 to the upper left.

In the pixel on the upper right of the basic cell, both the first optical waveguide 103 and the second optical waveguide 104 are shifted from the center of the light receiving unit 1 to the upper right.

In the pixel on the lower left of the basic cell, both the first optical waveguide 103 and the second optical waveguide 104 are shifted from the center of the light receiving unit 1 to the lower left.

In the pixel on the lower right of the basic cell, both the first optical waveguide 103 and the second optical waveguide 104 are shifted from the center of the light receiving unit 1 to the lower right.

In a third modified embodiment shown in FIG. 19, each basic cell is constructed of two pixels which are arranged in the column direction and share floating diffusion. In this example, transistors Tr are arranged on the upper and lower sides of a basic cell.

In the upper pixel of the basic cell, both the first optical waveguide 103 and the second optical waveguide 104 are sifted to the upper side from the center of the light receiving unit 1.

In the lower pixel of the basic cell, both the first optical waveguide 103 and the second optical waveguide 104 are shifted from the center of the light receiving unit 1 to the lower right.

In each of the first and second embodiments described above, the description has been made with respect to the imaging device in which the center C thereof is located on the floating fusion FD on the center of the pixels in the basic cell. In the present invention, the position of the center of the imaging device is not only limited to the position of the floating diffusion FD and may be alternatively located on another place. For example, it may be located in the inside of the pixel, such as the inside of the light receiving unit, or located between the basic cells, such as on a place near the transistor therebetween.

Figure 20:
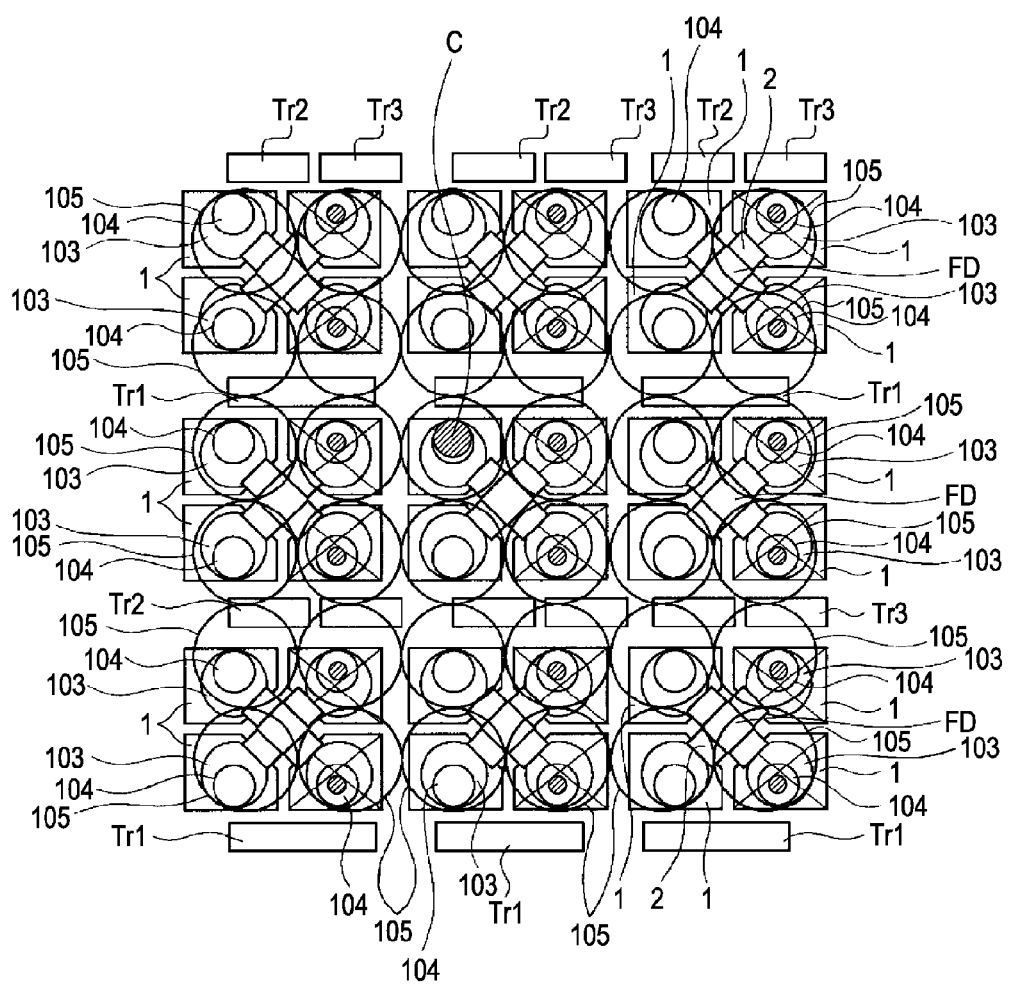
FIG. 20 is a diagram that illustrates a modified embodiment corresponding to the embodiment shown in FIG. 1 but different in position of the center of the imaging device.
Figure 21:
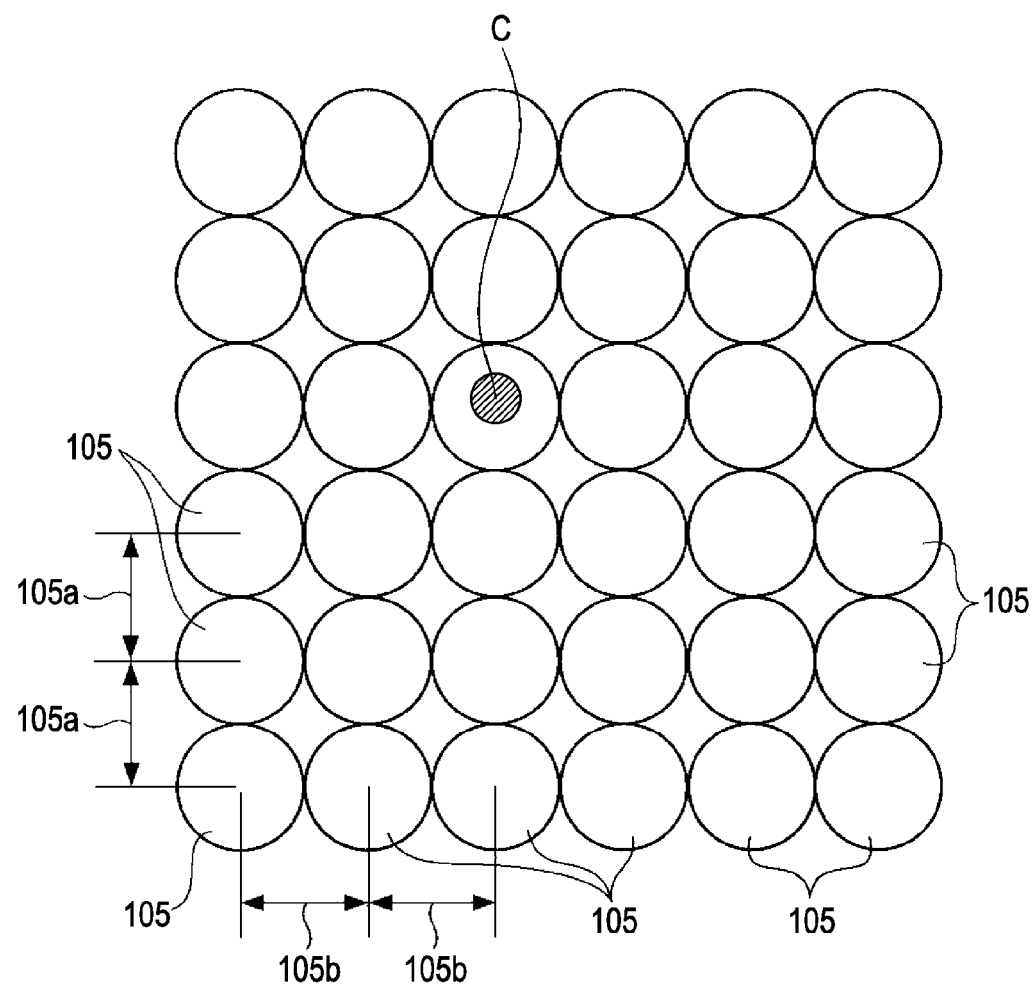
FIG. 21 is a diagram that illustrates a modified embodiment corresponding to the embodiment shown in FIG. 4 but different in position of the center of the imaging device.

Referring now to FIG. 20 and FIG. 21, which are plane views corresponding to FIG. 1 and FIG. 4, a modified embodiment with the center C of the imaging device located in the inside of the light receiving unit will be described. As shown in FIG. 20 and FIG. 21, the center C of the imaging device is located in the inside of the light receiving unit 1 and near the center of the on-chip lens 105.

4. Solid-State Imaging Device of Third Embodiment

Figure 22:
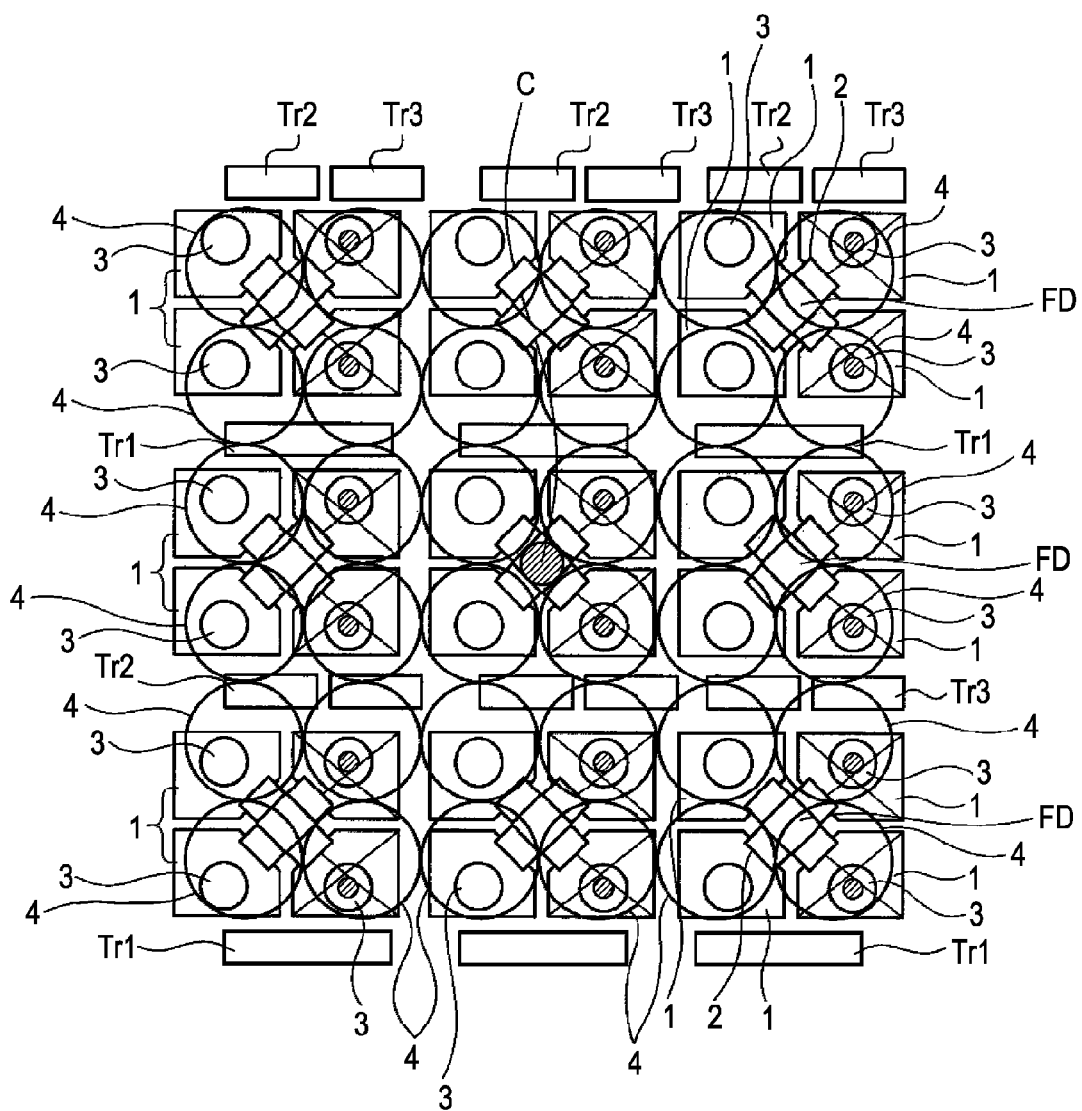
FIG. 22 is a plane diagram that illustrates a schematic configuration of a solid-state imaging device according to a third embodiment of the present invention.

FIG. 22 is a plane diagram that illustrates a schematic configuration of a solid-state imaging device according to a third embodiment of the present invention.

As shown in FIG. 22, the solid-state imaging device is constructed of a plurality of pixels arranged in matrix form, a rectangular array of pixels in rows and columns.

For instance, FIG. 22 illustrates 36 pixels (6 pixels per row×6 pixels per column) that surround the center C of the imaging device.

In the figure, reference numeral 3 denotes an optical waveguide and 4 denotes an on-chip lens.

Each pixel has a photodiode that includes a light receiving unit 1, an optical wave guide 3, and an on-chip lens 4. The light receiving unit 1 performs photoelectric conversion of the received light. The optical waveguide 3 introduces incident light into the light receiving unit 1. The on-chip lens 4 converges the incident light.

Four pixels in total, two in column×two in row, share a floating diffusion FD that can accumulate electric charges produced by optical conversion. In each of the four pixels, a transfer gate 2 is formed between the light receiving unit 1 and the floating diffusion FD shared by four pixels.

In addition, transistors Tr1, Tr2, and Tr3 are arranged on the upper and lower sides of the four pixels with the shared floating diffusion FD.

The exemplary configurations of the respective transistors Tr1, Tr2, and Tr3 include, but not particularly limited to, an amplification transistor, a reset transistor, and a selection transistor.

Figure 23:
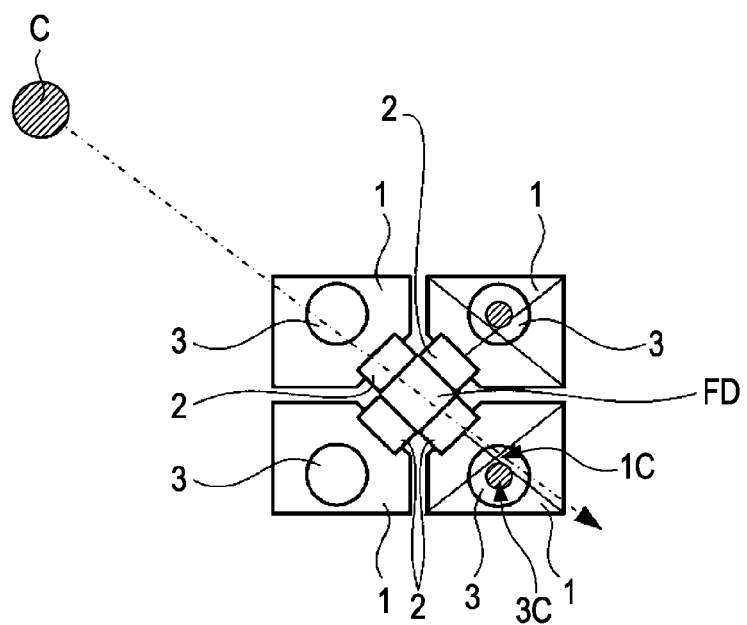
FIG. 23 is a plane diagram that illustrates a basic cell with four pixels in the solid-state imaging device shown in FIG. 22.

FIG. 23 illustrates four pixels located on the lower right side of FIG. 22.

In the solid-state imaging device of the present embodiment, the four pixels that share the floating diffusion FD is provided as a basic cell. In FIG. 23, the basic cell on the lower right side of FIG. 22 and the center C of the imaging device are illustrated.

As shown in FIG. 23, in each of the four pixels, the center 3C of the optical waveguide 3 is shifted from the center 1C of the light receiving unit 1.

Specifically, in two upper pixels in the figure, the center 3C of the optical waveguide 3 is shifted upward from the center 1C of the light receiving unit 1. In two lower pixels in the figure, the center 3C of the optical waveguide 3 is shifted downward from the center 1C of the light receiving unit 1.

Here, consideration is given to a line drawn from the center C of the imaging device to the center 1C of the light receiving unit 1 of each pixel. In the case of the two upper pixels, the distance from the center C of the imaging device to the center 3C of the optical waveguide 3 is shorter than the distance from the center 1C of the light receiving unit 1. In contrast, in the case of the two lower pixels, the distance from the center C of the imaging device to the center 3C of the optical waveguide 3 is longer than the distance from the center 1C of the light receiving unit 1. In other words, the basic cell includes a mixture of two different kinds of pixels, those in which the distance from the center C of the imaging device to the center 3C of the optical waveguide 3 is shorter than the distance from the center 1C of the light receiving unit 1 and others in which the distance is longer.

Referring back to FIG. 22, the plane view of the entire pixel, it is also found mixed two different kinds of pixels, those in which the distance from the center C of the imaging device to the center 3C of the optical waveguide 3 is shorter than the distance from the center 1C of the light receiving unit 1 and others in which the distance is longer. The pixels, in which the distance from the center C of the imaging device to the center 3C of the optical waveguide 3 is shorter than the distance from the center 1C of the light receiving unit 1, are pixels on the second row from the upper side and pixels on the second row from the lower side of the figure. In pixels on the remaining four rows, the distance from the center C of the imaging device to the center 3C of the optical waveguide 3 is longer than the distance from the center 1C of the light receiving unit 1.

In the imaging device described in Japanese Patent Laid Open No. 2006-261249, on the other hand, all of the pixels are those in which the distance from the center C of the imaging device to the center 3C of the optical waveguide 3 is equal to or shorter than the distance from the center 1C of the light receiving unit 1. There is no pixel in which the distance from the center 3C of the optical waveguide 3 is longer than the distance from the center 1C of the light receiving unit 1. In this regard, the configuration of the imaging device of the present embodiment completely differs from the typical imaging device disclosed in the aforementioned document.

Figure 24:
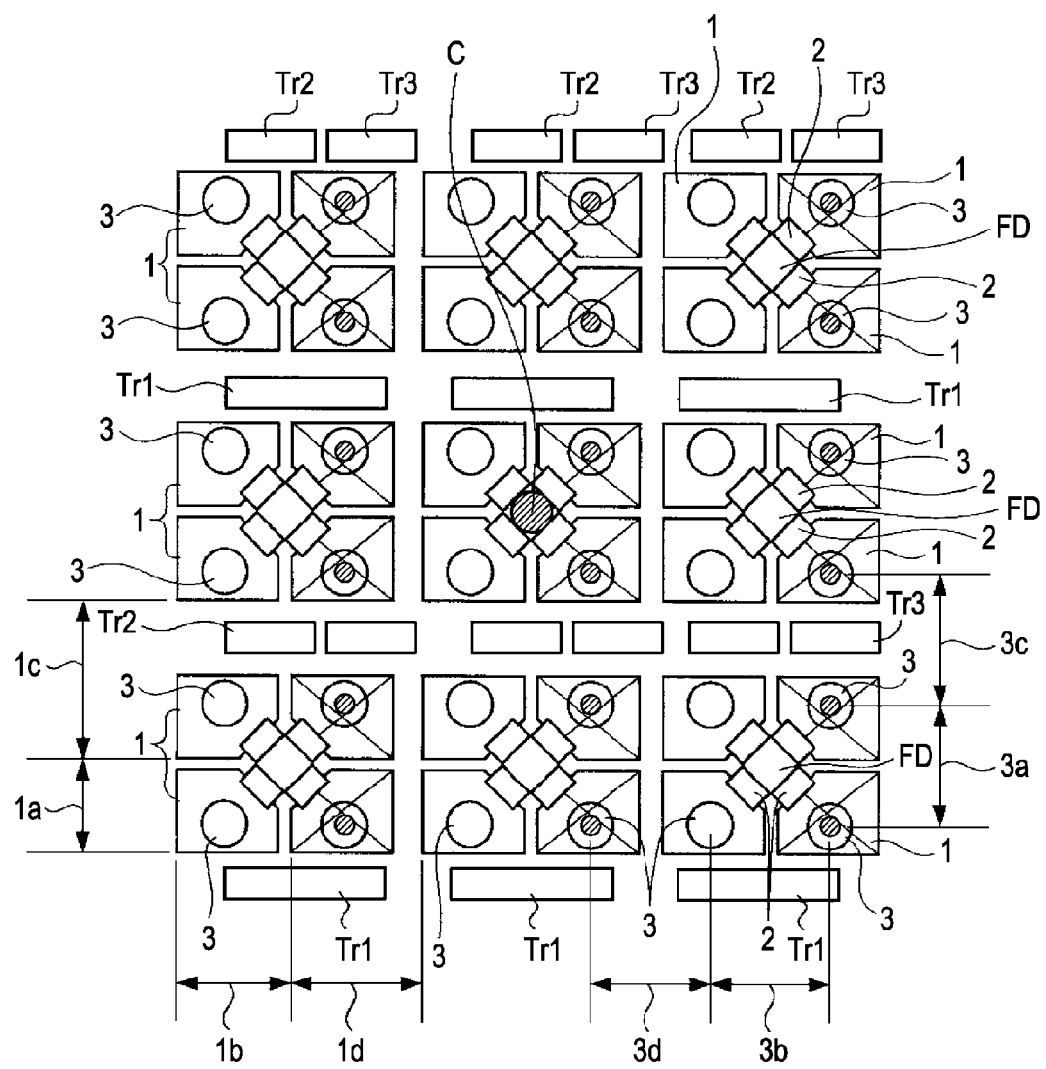
FIG. 24 is a diagram that illustrates some of structural components shown in FIG. 22, such as first optical waveguides, optical waveguides, light receiving units, and transistors.
Figure 25:
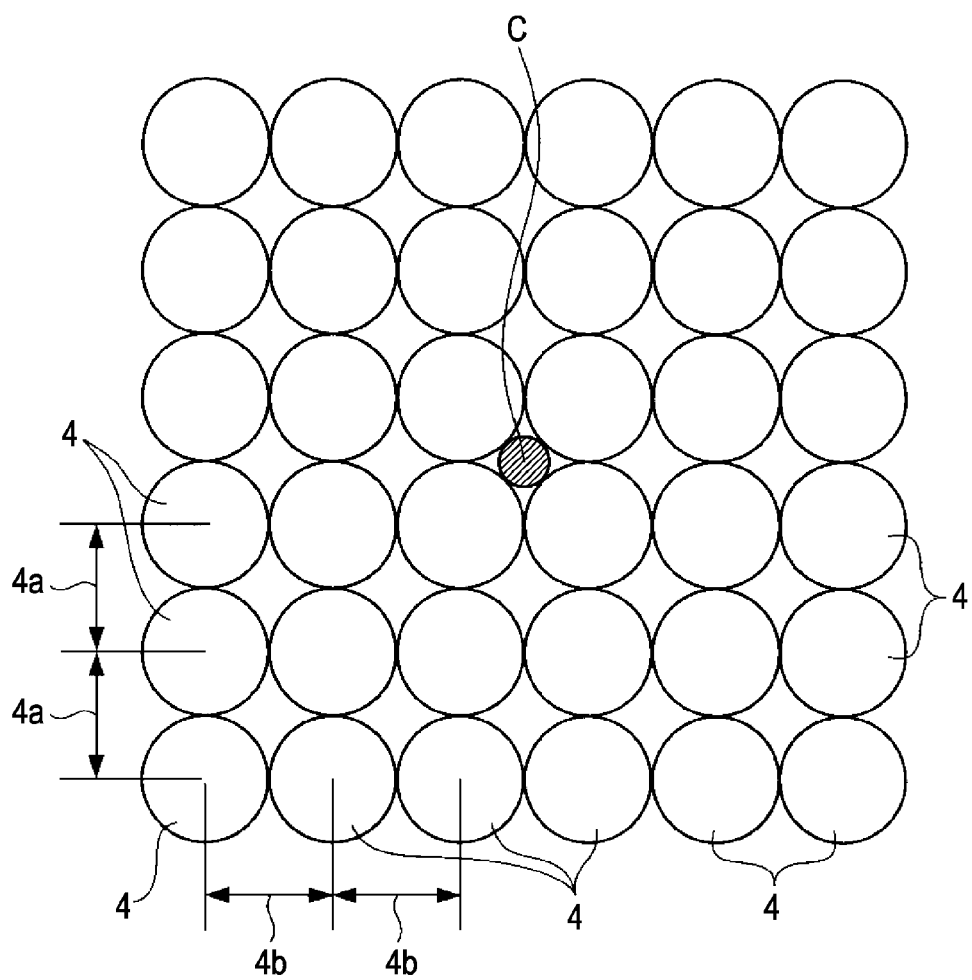
FIG. 25 is a diagram that illustrates on-chip lenses among structural components shown in FIG. 22.
Figure 26:
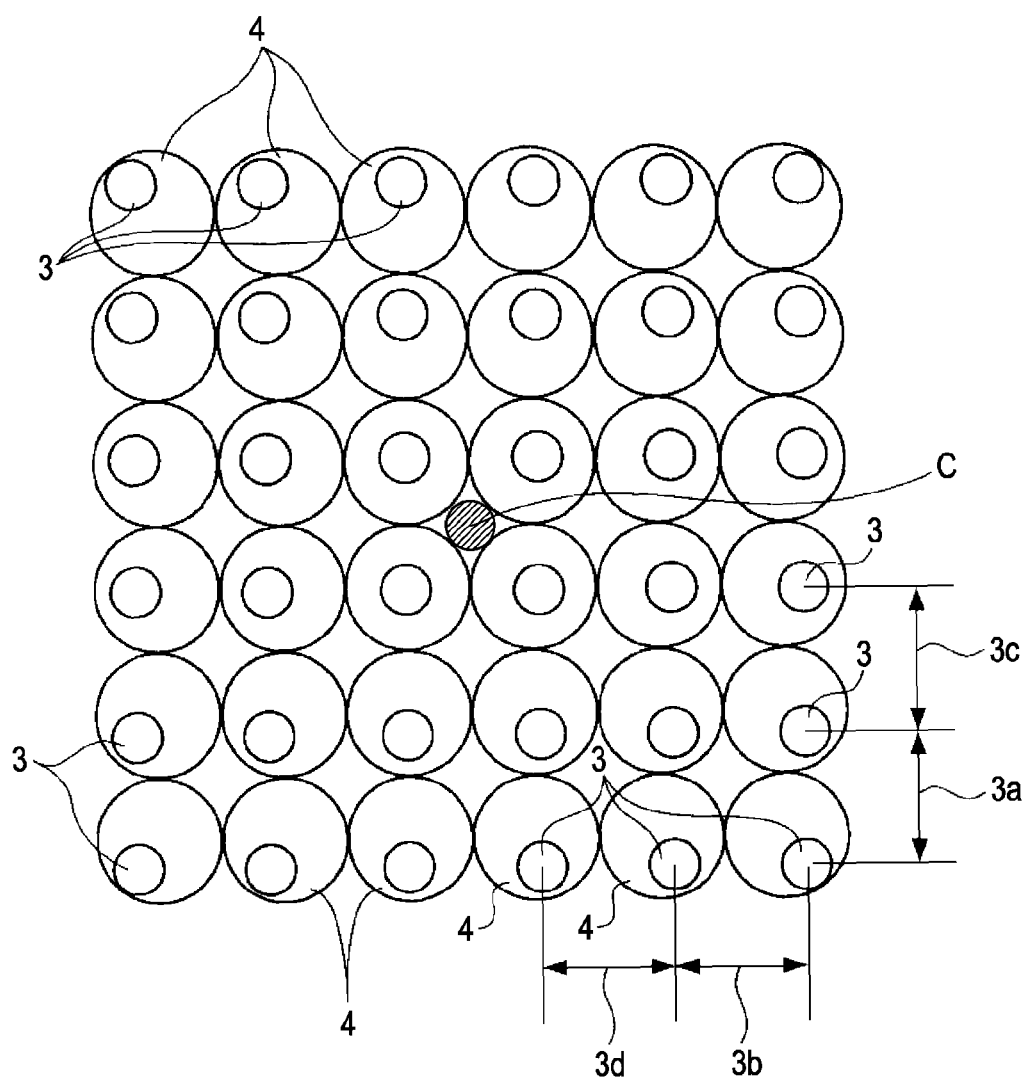
FIG. 26 is a diagram that illustrates on-chip lenses and optical waveguides among structural components shown in FIG. 22.

Each of FIG. 24 to FIG. 26 is a plane view of some components of the solid-state imaging device shown in FIG. 22. FIG. 24 illustrates the optical waveguides 3, the light receiving units 1, the transistors Tr1, Tr2, and Tr3, and so on. FIG. 25 represents only the on-chip lenses 4. FIG. 26 represents both the on-chip lenses 4 and the optical waveguides 3. In FIG. 24 to FIG. 26, the center C of the imaging device is also represented together with these components.

As shown in FIG. 24, the light receiving units 1 of the respective pixels are regularly arranged so that four pixels form a basic cell.

Four pixels of the basic cell are concentrically located around the shared floating diffusion FD.

On the other hand, the upper two pixels of the pixels and the lower two pixels in the column direction are spaced from each other and sandwich the transistors Tr1, Tr2, and Tr3. In addition, the space between the pixels is changed ever other row. In other words, in the row direction, the distance 1c between the pixels of the adjacent basic cells through the transistor is larger than the distance 1a between the pixels in the same basic cell.

Also, in the column direction, the distance between the pixels of the adjacent basic cells is larger than the distance of the pixels in the same basic cell. Furthermore, the distance between the pixels is changed every other column. That is, the distance 1d between the pixels of the adjacent basic cells is larger than the distance 1b between the pixels of the same basic cells. In contrast, the optical waveguide 3 is arranged at a substantially equal distance in both the column and row directions. That is, in the column direction, the distance 3a between the second optical waveguides 3 in the same basic cell is almost equal to the distance 3c between the optical waveguides 3c in the adjacent basic cells that sandwich the transistor. In the row direction, the distance 3b between the optical waveguides 3 in the same basic cell is almost equal to the distance 3d between the optical waveguides 3d in the adjacent basic cells.

Furthermore, in each of the pixels, the planar configuration of the optical waveguide 3 is included in the inside of the light receiving unit 1. As shown in FIG. 25, the on-chip lenses 4 are arranged substantially at an equal distance from one another in columns and rows. That is, in the column direction, the distance between the on-chip lenses 4 of the same basic cell is substantially equal to the distance between the lenses 4 of the adjacent basic cells that sandwich the transistor. Thus, these distances are represented by the same reference numeral 4a. In addition, in the row direction, the distance between the on-chip lenses 4 of the same basic cell is substantially equal to the distance between the lenses 4 of the adjacent basic cells that sandwich the transistor. Thus, these distances are represented by the same reference numeral 4b.

If the on-chip lenses are arranged at irregular intervals, a region without converged incident light, or an invalid zone, becomes extended in a portion with a relatively wide spacing between the on-chip lenses when the on-chip lenses of the respective pixels are prepared in the same diameter and the same curvature.

As shown in FIG. 26, a relative position between the optical waveguide 3 and the on-chip lens 4 varies depending on the position of the pixel.

In each of the pixels of two rows on the upper side, viewing from the center C of the imaging device, the optical waveguide 3 is located on the upper half of the on-chip lens 4. In each of the pixels of two rows on the opposite sides of the center C of the imaging device, the optical waveguide 3 is located near the center of the on-chip lens 4 in the column direction. In each of the pixels of two rows on the lower side, viewing from the center C of the imaging device, the optical waveguide 3 is located on the lower half of the on-chip lens 4.

In each of the pixels of two columns on the right side, viewing from the center C of the imaging device, the optical waveguide 3 is located on the right half of the on-chip lens 4. In each of the pixels of two columns on the opposite sides of the center C of the imaging device, the optical waveguide 3 is located near the center of the on-chip lens 4 in the row direction. In each of the pixels of two columns on the left side, viewing from the center C of the imaging device, the optical waveguide 3 is located on the left half of the on-chip lens 4.

Furthermore, in each of the pixels, the planar configuration of the optical waveguide 3 is included in the inside of the on-chip lens 4.

In this third embodiment, a relative position between the on-chip lens 4 and the light receiving unit 1 is changed depending on the position of the pixel viewing from the center of the imaging device. In addition, the on-chip lens 4 is shifted from the center 1C of the light receiving unit to the center C of the imaging device depending on the distance from the center C of the imaging device to the pixel.

In other words, the on-chip lens 4 has been processed by pupil correction. In contrast, the optical waveguide 3 have not been processed by pupil correction.

Furthermore, the distances among the components are as follows:

In the case of two pixels on the upper and lower sides of the same basic cell, the distance 3a between the optical waveguides is longer than the distance 1a between the pixels. In the case of two pixels on the right and left sides of the same basic pixel, the distance 3b between the optical waveguides is slightly longer than the distance 1b between the pixels.

The distance 1a between two pixels on the upper and lower sides of the same basic pixel is different from the distance 1c between the pixels of the adjacent basic cells that sandwich the transistor.

In this way, if the optical waveguide 3 in each pixel is arranged near the center 1c of the light receiving unit 1 when the pixel distance 1a and the pixel distance 1c are different from each other, incident-angle dependency is shifted. Thus, the incident-angle dependency of the optical waveguide 3 varies and the optical properties of causing some phenomena, such as horizontal stripes and shading, can be affected.

On the other hand, if the position of the optical waveguide 3 is shifted from near the center of the light receiving unit 1 and the distances between the optical waveguides are arranged at regular intervals, the optical properties can be improved.

In addition, the waveguide distance 3a and the waveguide distance 3c are almost the same. Even though it is preferable that the waveguide distance 3a and the waveguide distance 3c are equal to each other, the waveguide distance 3a and the waveguide distance 3c may be unequal to each other.

If the distances between the optical waveguides are arranged at regular intervals, an increase in incident-angle dependency in the column direction occurs and the optical properties of causing some phenomena, such as horizontal stripes and shading, can be improved. In addition, the waveguide distance 3b and the waveguide distance 3d are almost the same. It may not be the same although the same thing of waveguide distance 3b and 3d of waveguide distances is desirable. As compared with the distance 1b between two pixels on the right and left sides of the same basic cell, the distance 1d between pixels of the adjacent basic cells in the row direction is slightly longer.

By the way, the distance 1b between the pixels and the distance 1d between the pixels may be substantially equal. The waveguide distance 3b and the waveguide distance 3d are substantially the same and the pixel distance 1b and the pixel distance 1d are different from each other. Thus, the center 3C of the optical waveguide 3 is shifted from the center 1C of the light receiving unit 1 in the row direction. In other words, the center 3C of the optical waveguide 3 is shifted to the left or right of the adjacent basic cell, or shifted away from the floating diffusion FD on the center of the basic cell.

The sum of the pixel distance 1a and the pixel distance 1c is equal to the sum of the waveguide distance 3a and the waveguide distance 3c. These sums are equivalent to pitches of the basic cells in the column direction.

The sum of the pixel distance 1b and the pixel distance 1d is equal to the sum of the waveguide distance 3b and the waveguide distance 3d. These sums are equivalent to pitches of the basic cells in the row direction.

The cross-sectional configuration of each pixel is not specifically limited as far as it includes the light receiving unit 1, the optical waveguide 3, and the on-chip lens 4.

Figure 27:
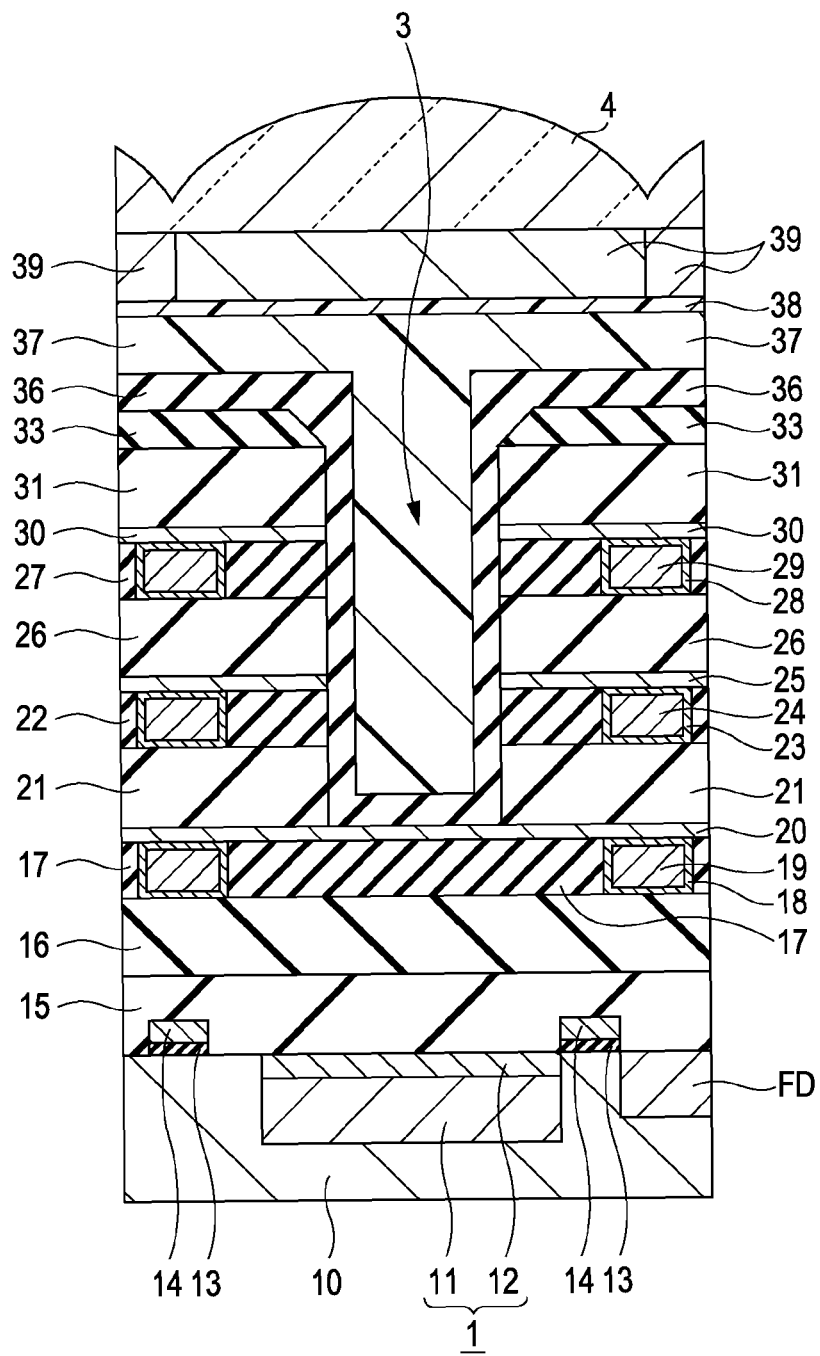
FIG. 27 is a cross-sectional view of a pixel in a solid-state imaging device shown FIG. 22.

FIG. 27 is a cross-sectional view of an exemplary configuration of a pixel of the solid-state imaging device shown in FIG. 22.

As shown in FIG. 27, the light receiving unit 1 is constructed by forming an n-type charge accumulation layer 11 on a p-well region or the like of a semiconductor substrate 10 and forming a p+-type positive charge accumulation layer 12 on the surface of the n-type charge accumulation layer 11. Furthermore, a gate insulating film 13 and a gate electrode 14 are formed on the semiconductor substrate 10 while being adjacent to the right side of the light receiving unit 1. The gate electrode 14 is a transfer gate 2 in FIG. 22. A floating diffusion FD is formed in the semiconductor substrate 10 while being adjacent to the right side of the gage electrode 14. In the cross-section (not shown) of the semiconductor substrate 10, source/drain regions of the transistors Tr1, Tr2, and Tr3 are formed. The application of a voltage to the gate electrode 14 leads to transfer of signal charges from the light receiving unit 1 to the floating diffusion FD.

Insulating films made of silicon oxide or the like are laminated on the semiconductor substrate 10 while covering the light receiving unit 1. The insulating films include a first insulating film 15, a second insulating film 16, a third insulating film 17, a fourth insulating film 21, a fifth insulating film 22, a sixth insulating film 26, a seventh insulating film 27, and an eighth insulating film 31. In addition, a first diffusion preventing film 20 and a second diffusion preventing film 25, which are made of silicon carbide or the like, and a third diffusion preventing film 30, which is made of silicon nitride or the like, are laminated among the insulating films, respectively. The lamination of these insulating films and diffusion preventing films makes an insulating layer as a whole.

A wiring groove is formed in the third insulating film 17 and a first wiring layer constructed of a barrier metal layer 18 and a conductive layer 19 is then buried in the wiring groove. Likewise, a wiring groove is formed in the fifth insulating film 22 and a second wiring layer constructed of a barrier metal layer 23 and a conductive layer 24 is then buried in the wiring groove. Likewise, a wiring groove is formed in the seventh insulating film 27 and a second wiring layer constructed of a barrier metal layer 28 and a conductive layer 29 is then buried in the wiring groove. Each of the barrier metal layers 18, 23, and 28 may be, for example, a stacked film of tantalum/tantalum nitride. Also, each of the conductive layers 19, 24, and 29 may be any of various metallic materials for wiring lines, such as copper. The above first to third diffusion preventing films are provided for preventing the metal such as copper of the conductive layers 19, 24, and 29 from being dispersed.

A ninth insulating film 33 made of silicon oxide is formed on the eighth insulating film 31.

Furthermore, a depressed portion is formed above the light receiving unit 1 so that it passes through the fourth to ninth insulating films 21 to 33 and the second and third diffusion preventing films 25 and 30, which are laminated as described above. The first diffusion preventing film 20 is formed on the bottom of the depressed portion.

The inner wall surface of the depressed portion is perpendicular to the principal plane of the substrate. Part of the ninth insulating film 33 is provided as an edge of the depressed portion and forms an opening that broadens out upwardly in a forward tapered shape.

A passivation film 36 is formed and covers the inner wall surface of the depressed portion. In addition, for example, a buried layer 37 is formed on the passivation film 36 and buried in the depressed portion. The buried layer 37 has a refractive index higher than that of the silicon oxide (refractive index 1.45) of the insulating film. The buried layer 37 completely fills the inside of the depressed portion.

The buried layer 37 may be made of resin with a high refractive index, such as siloxane resin (refractive index 1.7) or polyimide. To increase the refractive index, these resin materials may contain any of metal oxide particulates including those of titanium oxide, tantalum oxide, niobium oxide, tungstic oxide, zirconium dioxide, zinc oxide, indium oxide, and hafnium oxide. As long as it can be buried in the inside of the depressed portion, any inorganic material with a high refractive index may be used.

The passivation film 36 may be made of a material with a refractive index equal to or near that of silicon oxide used for the insulating film or a material with a refractive index higher than that of the silicon oxide. Examples of the materials with higher refractive indexes include silicon nitride and silicon oxynitride (SiON).

If the passivation film 36 is made of a material with a refractive index equal to or near that of silicon oxide used for the insulating film, the buried layer 37 in the inside of the depressed portion serves as the optical waveguide 3 on the upper side.

If the passivation film 36 is made of a material with a refractive index higher than that of silicon oxide used for the insulating film, the optical waveguide 3 on the upper side is constructed of the passivation film 36 and the buried layer 37 in the inside of the depressed portion.

Planarizing resin layer 38 which functions also, for example as a bonding layer is formed in the upper layer of buried layer 37, and color filter 39 of each color of blue B, green G, and red R is formed in it for every pixel at the upper layer, for example. Furthermore, an on-chip lens 4 is formed on the color filter 39.

As shown in FIG. 27, the optical waveguide 3 is formed so that the width of the optical waveguide 3 is smaller than the width of the light receiving unit 1 and the width of the on-chip lens 4 and the position thereof in the surface of the solid-state imaging device is located within the position in the surface of the solid-state imaging device of each of the light receiving unit 1 and the on-chip lens 4.

On the basis of the pixel structure shown in FIG. 27, a pixel is formed such that the position in the surface of the solid-state imaging device of each of the light receiving unit 1, the optical waveguide 3, and the on-chip lens 4 is shifted with respect to the position of the pixel from the center C of the imaging device.

For instance, the solid-state imaging device with the cross-sectional structure of the pixel shown in FIG. 27 can be manufactured as follows:

An n-type charge accumulation layer 11 is formed on a p-well region or the like of a semiconductor substrate 10 and a p+-type positive charge accumulation layer 12 is then formed on the surface of the n-type charge accumulation layer 11 to provide a light receiving unit 1. In addition, a gate insulating film 13 and a gate electrode 14 are formed on the semiconductor substrate 10 while being adjacent to the light receiving unit 1. Furthermore, a floating diffusion FD as well as source/drain regions of the transistors Tr1, Tr2, and Tr3 are formed in the semiconductor substrate 10.

Next, for example, the light receiving unit 1 is covered with silicon oxide deposited on the entire surface of the light receiving unit 1 by a chemical vapor deposition (CVD) method or the like to form a first insulating film 15. Subsequently, for example, silicon oxide is deposited on the first insulating film 15 to form a second insulating film 16 and silicon oxide is further deposited thereon to form a third insulating film 17.

Next, for example, the third insulating film 17 is subjected to etching processing to form a wiring line groove. The inner wall of the wiring groove is covered with, for example, tantalum/tantalum oxide by spattering to form a barrier metal layer 18.

After that, a copper seed layer is formed and subjected to electrolytic plating to form a copper film on the entire surface of the structure. Then, the resulting film is subjected to chemical mechanical polish (CMP) or the like to remove the copper form on the outside of the wiring groove, thereby forming a conductive layer 19.

Moreover, a barrier metal layer 18 is formed on the surface of the conductive layer 19 and the portion thereof formed on the outside of the wiring groove is then removed. In FIG. 6, the barrier metal layer 18 is also formed on the surface of the conductive layer 19. However, if it is not desired to form the barrier metal layer 18 on the surface of the conductive layer 19, this step is omitted.

Thus, a first wiring layer constructed of the barrier metal layer 18 and the conductive layer 19, which are buried in the wiring groove, is formed.

Next, for example, silicon carbide is deposited on the first wiring layer to form a first diffusion preventing film 20.

Subsequently, the same procedures as those used for the formation of the second insulating film 16, the third insulating film 17 and the wiring groove thereof, the first wiring layer constructed of the barrier metal layer 18 and the conductive layer 19, and the first diffusion preventing film 20. Consequently, the procedures form a fourth insulating layer 21, a fifth insulating layer 22 and the wiring groove thereof, a second wiring layer constructed of a barrier metal layer 23 and a conductive layer 24, a second diffusion preventing film 25, a sixth insulating film 26, a seventh insulating film 27 and the wiring groove thereof, and a third wiring layer constructed of a barrier metal layer 28 and a conductive layer 29. Furthermore, for example, silicon nitride is deposited by the CVD method to form a third diffusion preventing film 30. Next, an eighth insulating film 31 is formed on the third diffusion preventing film 30.

Then, for example, silicon oxide is deposited on the entire surface of the eighth insulating film 31 to form a ninth insulating film 33.

Subsequently, for example, a resist film is subjected to the pattern formation of the opening of a depressed portion by a photolithography process, followed by being subjected to isotropic etching or anisotropic etching. As a result, an opening that broadens out upwardly in a forward tapered shape is formed in the ninth insulating film 33.

Next, the resist film is removed and, for example, a second resist film is then patterned with the same pattern as that of the first resist film. The patterned second resist film is subjected to anisotropic etching, such as reactive ion etching, to form a depressed portion passing through the fourth to ninth insulating films 21 to 33, the second diffusion preventing film 25, and the third diffusion preventing film 30. During the formation of such a depressed portion, for example, the etching is proceeded while the conditions thereof are changed depending on the materials of silicon nitride, silicon carbonide, and so on as well as silicon oxide. The etching is promptly stopped when the bottom of the opening reaches to the first diffusion preventing film 20. As a result, the first diffusion preventing film 20 serves as the bottom of a depressed portion. Thus, the constant depth of the depressed portion leads to the constant distance between the light receiving unit 1 and the optical waveguide 3.

In this way, part of the ninth insulating film 33 is provided as an edge of the depressed portion and forms an opening in a forward tapered shape.

Next, for example, silicon nitride or silicon oxynitride (SiON) with a refractive index higher than that of silicon oxide is deposited on the inner wall of the depressed portion by a plasma CVD method at a deposition temperature of about 380° C. to form a passivation film 36.

As the edge of the opening is formed in a forward tapered shape, the profile of the passivation film 36 is formed so that, due to the anisotropy of the deposition, it is formed thicker at the edge of the opening and thinner at the bottom proximity of the depressed portion.

Next, for example, the passivation film 36 is coated with siloxane resin containing metal oxide particulates, such as titanium oxide, by a spin coat method at a deposition temperature of about 400° C. Thus, a buried layer 37 with a refractive index higher than silicon oxide is placed on the top of the passivation film 36 and buried in the depressed portion. After the application of the resin, for example, post-bake processing is performed at a temperature of about 300° C. if desired. In the case of polyamide resin, for example, the film formation may be performed at a temperature of about 350° C.

Next, for example, a planarizing resin layer 38 is formed on the top of the buried layer 37. The planarizing resin layer 38 can be also functioned as a bonding layer. On the top of the planarizing resin layer 38, for example, a color filter 39 of each of blue (B), green (G), and red (R) is provided for every pixel. Subsequently, an on-chip lens 4 is formed on the top of the color filter 39.

In the manufacturing method described above, hydrogen disposal (sintering) may be performed for terminating the dangling bond in the semiconductor after the step of forming the third wiring layer but before the step of forming the buried layer.

Therefore, the solid-state imaging device with the cross-sectional structure of the pixel shown in FIG. 27 can be manufactured.

Figure 28:
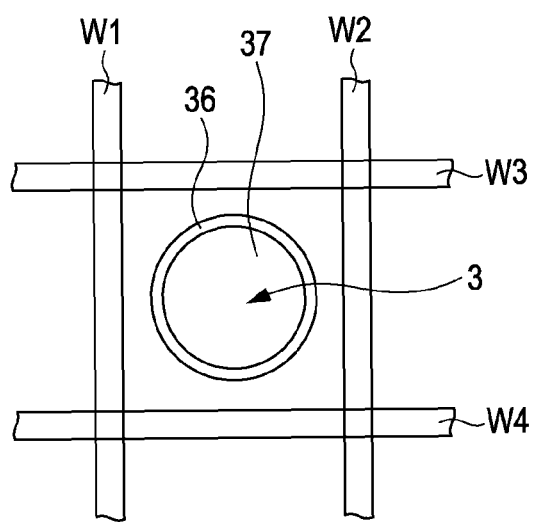
FIG. 28 is a schematic diagram that illustrates a planar layout of the pixel.

Then, the planar layout of the pixel is schematically illustrated in FIG. 28.

The buried layer 37 of circular cross section (and the passivation film 36) forms an optical waveguide 3.

The wiring layers, such as the first to third wiring layers in FIG. 27, are formed so that they are arranged like a mesh structure to surround the optical waveguide 3 in the insulating films. The term "mesh structure" means that, for example, the wiring layers and the insulating films are alternately stacked in the column direction. For instance, the optical waveguide 3 is arranged in an area surrounded by the wiring layers W1 and W2 extending in the column direction and the wiring layers W3 and W4 extending in the horizontal direction. The wiring layers W1, W2, W3, and W4 may have their own mesh structures.

Although the light receiving unit 1 is not represented in FIG. 28, the light receiving unit 1 is formed more outside from the optical waveguide 3. For example, in the case of the cross-sectional structure shown in FIG. 6, the outer edge of the light receiving unit 1 is located near the locations of the wiring layers W1, W2, W3, and W4.

Referring again to FIG. 8, an exemplary arrangement of color filter colors on 36 pixels shown in FIG. 22 will be described.

In the arrangement of colors shown in FIG. 8, one red (R), one blue (B), and two green (G: Gb and Gr) color filters are assigned to each of four pixel of every basic cell. Then, the green (Gb) and the green (Gr) are assigned to the pixels that face to each other through the floating diffusion DF. Also, the red (R) and the blue (B) are assigned to the pixels that face to each other through the floating diffusion DF.

Here, the solid-state imaging device with the planar layout shown in FIG. 22 and the arrangement of color filters shown in FIG. 8 different cross-sectional profiles was actually manufactured.

As a comparative example, a solid-state imaging device was manufactured such that optical waveguides 3 were arranged at irregular intervals. That is, the configuration of the solid-state imaging device shown in FIG. 24 was modified such that the waveguide distance 3a was different from the waveguide distance 3c.

Figure 29A:
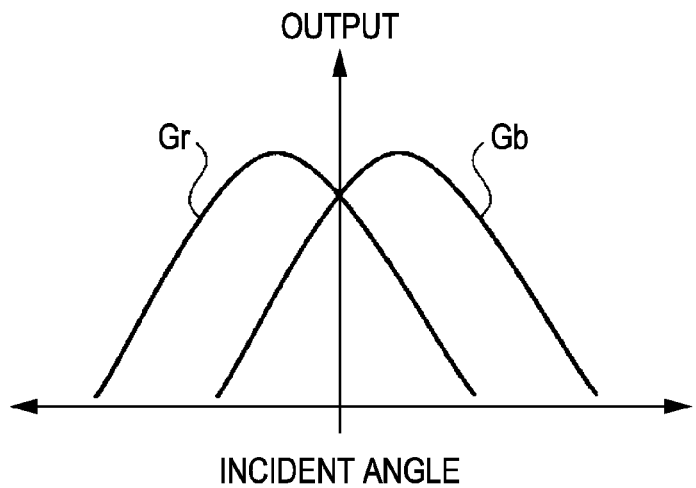
FIG. 29A illustrates a case in which optical waveguides are arranged at irregular intervals and FIG. 29B illustrates a case at regular intervals.
Figure 29B:
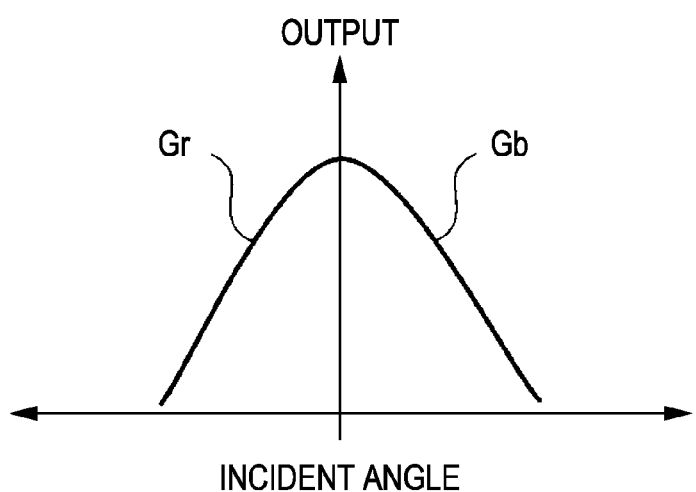

The solid-state imaging device of the present invention and that of the comparative example were subjected to examinations of output variations due to a change in angle of incident light with respect to the pixels of green (Gb) color filter and the pixels of green (Gr) color filter. Results are shown in FIG. 29A and FIG. 29B. FIG. 29A shows the results obtained from the comparative example in which the optical waveguides 3 are arranged at irregular intervals.

FIG. 29B shows the results obtained from the present embodiment in which the optical waveguides 3 are arranged at regular intervals.

As is evident from FIG. 29A, the device of the comparative example in which the optical waveguides 3 are arranged at irregular intervals causes an output difference regardless of using the pixels of the same color.

As is evident from FIG. 29B, the device of the present example in which the optical waveguides 3 are arranged at regular intervals causes the same output. Furthermore, the pixel qualities of the device were also performed. As a result, characteristics, such as horizontal stripes, irregular color, and shading, are improved.

Therefore, it is preferable to make the intervals of the optical waveguide 3 constant. However, even if the intervals are not constant, the imaging device has no particular disadvantage in use as long as the intervals are within a certain range of values.

Referring back to FIG. 9, an exemplary equivalent circuit of four pixels of a basic cell in the solid-state imaging device according to the third embodiment of the present invention will be described.

As shown in FIG. 9, the light receiving unit 1 constructed of four photodiodes are connected to the common floating diffusion FD through the transfer gate 2. In addition, the floating diffusion FD is connected to one of source/drain regions of a reset transistor RST and the gate of an amplification transistor Amp. One of the source/drain regions of the amplification transistor is connected to one of the source/drain regions of a selection transistor SEL. The other of the source/drain regions of the reset transistor RST and the other of the source/drain regions of the amplification transistor Amp are connected to a power supply potential Vdd. The other of the source/drain regions of the selection transistor SEL is connected to a signal line 100. In other words, the part on the side of three transistors RST, Amp, and SEL from the floating fusion FD has the same configuration as that of a typical pixel having four transistors (including the transfer transistor of the transfer gate).

Referring now to FIG. 10, two examples in which the circuit configuration shown in FIG. 9 is realized will be described.

FIG. 10 is a diagram illustrating a positional relationship between transistors used by four pixels of a basic cell. The strip-shaped transistors Tr are arranged on the upper and lower sides of the basic cell with four pixels, respectively.

In the first example, as represented by the chain line in FIG. 10, the right half of the upper transistor Tr and the right half of the lower transistor Tr are used. The left halves of the respective transistors are used by four pixels of each of the basic cells located above and below the transistors.

In the second example, as represented by the dashed line in FIG. 10, the whole lower transistor is used. The upper transistor is used by four pixels of the basic cell located above the transistor.

An example of wiring in the first example is illustrated in FIG. 11A. The reset transistor RST is formed on the right half of the upper transistor Tr. In contrast, the amplification transistor Amp and the selection transistor SEL are formed on the right half of the lower transistor Tr. On each of the upper and lower side, a wiring line 110 is formed so that it connects the floating diffusion FD to one of the source/drain region of the reset transistor RST and the gate of the amplification transistor Amp.

An example of wiring in the second example is illustrated in FIG. 11B. The reset transistor RST is formed on the right half of the lower transistor Tr. The amplification transistor Amp is formed on the middle of the lower transistor Tr. The selection transistor SEL is formed on the left half of the lower transistor Tr. A floating diffusion FD and a gate of amplification transistor Amp are connected, wiring line 110 is formed in the bottom up and down, wiring line 110 branches on the right from the middle, and it is connected to one source/drain region of reset transistor RST. The wiring line 110 branches to the right from a halfway point thereof and is then connected to one of the source/drain regions of the reset transistor RST.

According to the above embodiment, four pixels of the basic cell share the floating diffusion FD and the transistors Tr1, Tr2, and Tr3. Therefore, as compared with a case in which floating diffusion FD and transistors Tr1, Tr2, and Tr3 are not shared, the percentage of the surface area of the light receiving unit 1 to the surface area of the pixel can be increased, or the surface area of the light receiving unit 1 can be extended. A decrease in area of the light receiving unit 1 when miniaturizing the pixel can be reduced. Therefore, it is possible to miniaturize the pixel substantially to the minimum wherever possible, while the dimensions of the optical waveguide 3 are prevented from becoming a limit of burying property.

Therefore, it is possible to miniaturize the pixel to cause an increase in integration of the solid-state imaging device. Also, it is possible to provide the imaging apparatus having the solid-state imaging device with more pixels and miniaturize such an imaging device.

According to the present embodiment, on-chip lenses 4 are formed at regular intervals. Thus, so-called invalid zones can be reduced and the generation of loss due to the invalid zone can be prevented. According to the present invention, furthermore, the planer position of the optical waveguide 3 is formed so that it can be shifted from the center 1C of the light receiving unit 1 to the transistors Tr1, Tr2, and Tr3. Besides, it is also formed so that it can be included in the inside of the light receiving unit 1 as well as the inside of the on-chip lens 4. Therefore, the light collected by the on-chip lens 4 can be fully led to the optical waveguide 3 and the light passed through the optical waveguide 3 can be then incident on the light receiving unit 1. In addition, the generation of mixed colors occurred when the light passed through the optical waveguide 3 enters the light receiving unit 1 of the adjacent pixel can be prevented.

Therefore, an increase in sensitivity and an increase in efficiency of photoelectric conversion can be attained. Thus, even if pixels are miniaturized, a solid-state imaging device with a sufficient sensitivity and a sufficient efficiency of photoelectric conversion and an imaging apparatus provided with such a soli-state imaging device can be realized.

According to the present embodiment, the optical waveguides 3 are arranged substantially at regular intervals. As shown in FIG. 29B, by equalizing a change in output due to the incident angle of light, characteristics, such as horizontal stripes, irregular color, and shading, can be improved.

In the third embodiment, the components are arranged so that the more the distance from the center C of the imaging device increases outwardly, the more the distance from the center of the on-chip lens 4 to the center of the optical waveguide 3 increases. The imaging device having such a configuration is preferably used for a camera with a short-focus optical lens (e.g., a cellular phone camera).

In the above description, the exemplary solid-state imaging device according to the third embodiment of the present invention includes 36 pixels as shown in FIG. 22. However, the present embodiment is not limited to such a configuration of the solid-state imaging device. In practice, the solid-state imaging device may include tens of thousands or more of pixels. For example, accumulated three-million pixels can be obtained by accumulating 750,000 basic cells (four pixels per cell).

In the above description, the third embodiment of the present invention is applied to the color solid-state imaging device using color filters as shown in FIG. 27 or FIG. 8.

According to the present embodiment, the solid-state imaging device is not limited to one using color filters. Alternatively, the embodiment may be applied to a monochrome solid-state imaging device, an infrared photo detecting solid-state imaging device, or a solid-state imaging device having some pixels provided for infrared photo detection without color filters.

5. Solid-State Imaging Device of Fourth Embodiment

Figure 30:
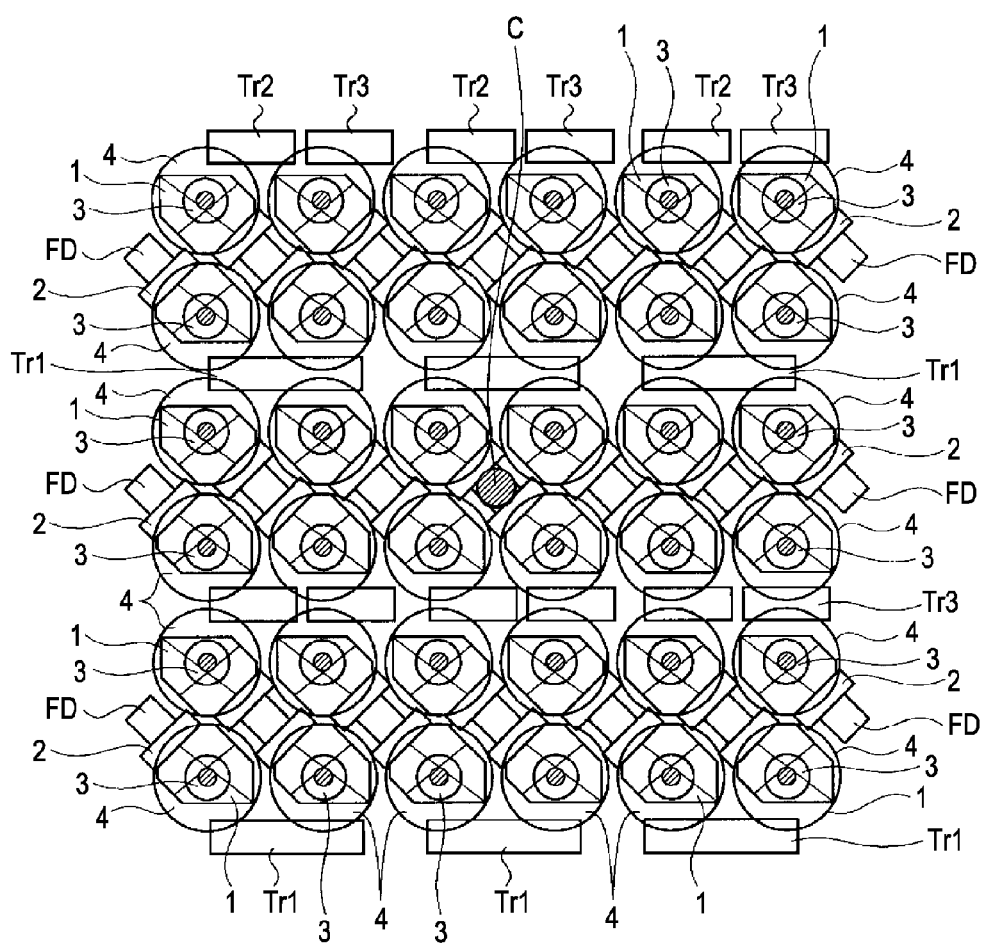
FIG. 30 is a plane diagram that illustrates a schematic configuration of a solid-state imaging device according to a fourth embodiment of the present invention.

FIG. 30 is a plane diagram that illustrates a schematic configuration of a solid-state imaging device according to a fourth embodiment of the present invention.

As shown in FIG. 30, the solid-state imaging device is constructed of a plurality of pixels arranged in matrix form, a rectangular array of pixels in rows and columns. For instance, FIG. 30 illustrates 36 pixels (6 pixels per row×6 pixels per column) that surround the center C of the imaging device.

Each pixel has a photodiode that includes a light receiving unit 1, an optical waveguide 3, and an on-chip lens 4. The light receiving unit 1 performs photoelectric conversion of the received light. The optical waveguide 3 introduce the incident light into the light receiving unit 1. The on-chip lens 4 converges the incident light.

Two pixels aligned in an oblique direction, one on the upper left side and the other on the lower right side, share a floating diffusion FD. In each of the two pixels, a transfer gate 2 is formed between the light receiving unit 1 and the floating diffusion FD shared by four pixels.

In addition, transistors Tr1, Tr2, and Tr3 are arranged on the upper and lower sides of the four pixels, two in the column direction and two in the row direction. The exemplary configurations of the respective transistors Tr1, Tr2, and Tr3 include, but not particularly limited to, an amplification transistor, a reset transistor, and a selection transistor.

Figure 31:
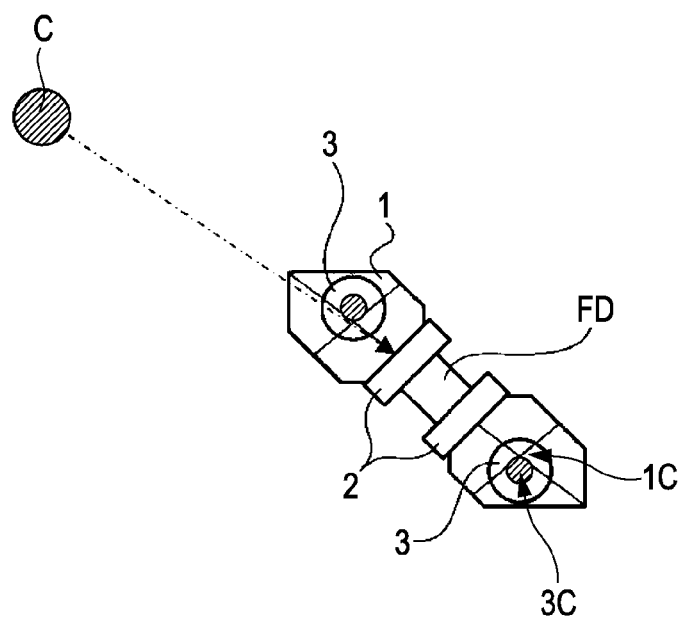
FIG. 31 is a plane diagram that illustrates a basic cell with two pixels in the solid-state imaging device shown in FIG. 30.

Here, among four pixels on the lower right side of FIG. 30, FIG. 31 illustrates two pixels that share the floating diffusion FD.

In the solid-state imaging device of the present embodiment, the two pixels that share the floating diffusion FD is provided as a basic cell. In FIG. 31, the basic cell on the lower right side of FIG. 30 and the center C of the imaging device are illustrated.

As shown in FIG. 31, in each of the tow pixels, the center 3C of the optical waveguide 3 is shifted from the center 1C of the light receiving unit 1.

Specifically, in the upper left pixel in the figure, the center 3C of the optical waveguide 3 is shifted upward from the center 1C of the light receiving unit 1. In the lower right pixel in the figure, the center 3C of the optical waveguide 3 is shifted downward from the center 1C of the light receiving unit 1.

Here, consideration is given to a line drawn from the center C of the imaging device to the center 1C of the light receiving unit 1 of each pixel. In the upper left pixel, the distance from the center C of the imaging device to the center 3C of the optical waveguide 3 is shorter than the distance from the center 1C of the light receiving unit 1. In the lower right pixel, the distance from the center C of the imaging device to the center 3C of the optical waveguide 3 is longer than the distance from the center 1C of the light receiving unit 1. In other words, the basic cell includes a mixture of two different kinds of pixels, those in which the distance from the center C of the imaging device to the center 3C of the optical waveguide 3 is shorter than the distance from the center 1C of the light receiving unit 1 and others in which the distance is longer.

Referring back to FIG. 30, the plane view of the entire pixel, it is also found mixed two different kinds of pixels, those in which the distance from the center C of the imaging device to the center 3C of the optical waveguide 3 is shorter than the distance from the center 1C of the light receiving unit 1 and others in which the distance is longer. The pixels, in which the distance from the center C of the imaging device to the center 3C of the optical waveguide 3 is shorter than the distance from the center 1C of the light receiving unit 1, are pixels on the second row from the upper side and pixels on the second row from the lower side of the figure. In pixels on the remaining four rows, the distance from the center C of the imaging device to the center 3C of the optical waveguide 3 is longer than the distance from the center 1C of the light receiving unit 1. This point is the same as that of the third embodiment of FIG. 22.

Figure 32:
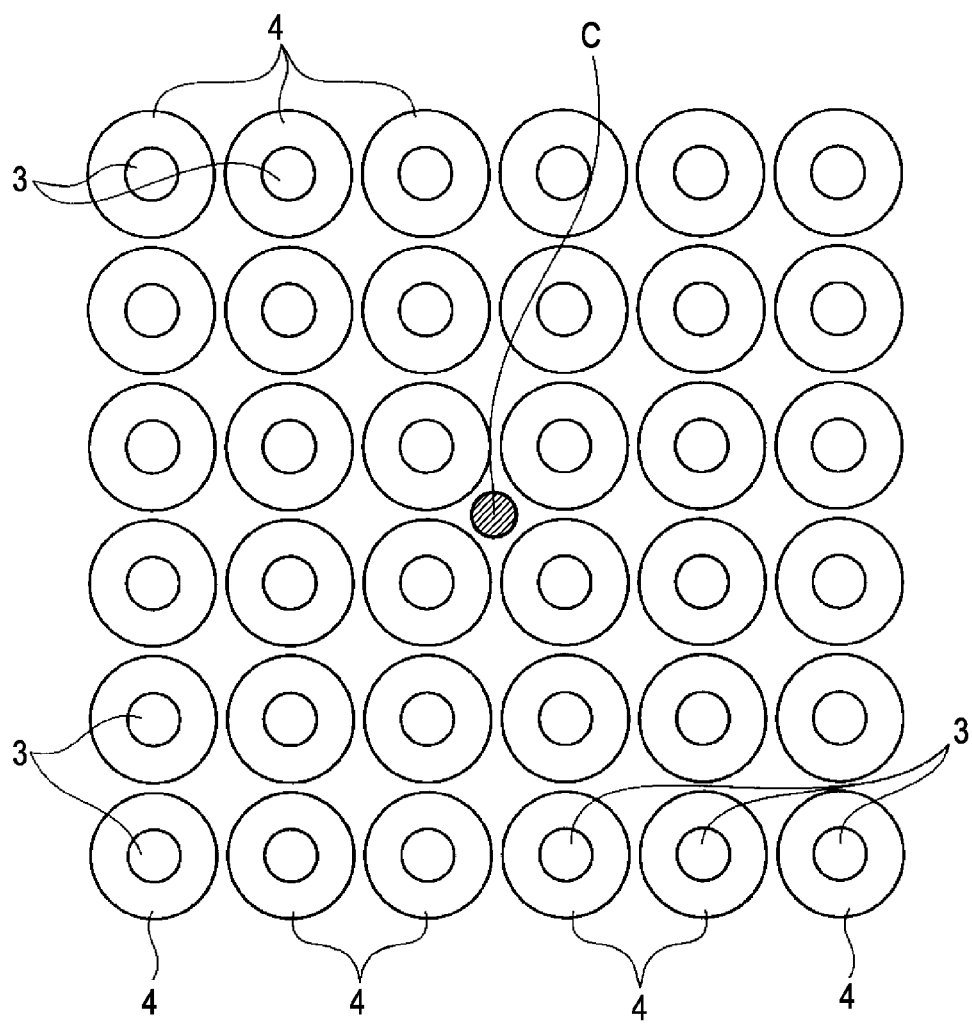
FIG. 32 is a diagram that illustrates on-chip lenses and optical waveguides among structural components shown in FIG. 30.

FIG. 32 represents the on-chip lenses 4 and the optical waveguides 3 shown in FIG. 30.

In FIG. 32, the center C of the imaging device is also represented together with these components.

As shown in FIG. 32, a relative position between the optical waveguide 3 and the on-chip lens 4 is substantially constant without depending on the position of the pixel. In this regard, the configuration of the imaging device of the second embodiment differs from that of the third embodiment.

In each pixel, the optical waveguide 3 is located near the center of the on-chip lens 4. As shown in FIG. 32, both the optical waveguide 3 and the on-chip lens 4 are arranged at an equal distance from one another in the column and row directions.

In this fourth embodiment, just as in the case with the relative position between the optical waveguide 3 and the light receiving unit 1, a relative position between the on-chip lens 4 and the light receiving unit 1 is substantially constant without depending on the position of the pixel. Then, the on-chip lens 4 is hardly shifted from the center 1C of the light receiving unit 1 in the row direction.

In other words, the on-chip lens 4 has not been processed by pupil correction. Likewise, the optical waveguide 3 have not been processed by pupil correction.

In this fourth embodiment, the cross-sectional configuration of each pixel is not specifically limited as far as it includes the light receiving unit 1, the optical waveguide 3, and the on-chip lens 4.

For example, the cross-sectional structure shown in FIG. 27 and the planar layout shown in FIG. 28 can be used.

FIG. 15 is a diagram illustrating an exemplary equivalent circuit of two pixels of a basic cell in the solid-state imaging device according to the fourth embodiment of the present invention.

As shown in FIG. 15, the light receiving unit 1 constructed of two photodiodes are connected to the common floating diffusion FD through the transfer gate 2. In addition, the floating diffusion FD is connected to one of source/drain regions of a reset transistor RST and the gate of an amplification transistor Amp. One of the source/drain regions of the amplification transistor is connected to one of the source/drain regions of a selection transistor SEL. The other of the source/drain regions of the reset transistor RST and the other of the source/drain regions of the amplification transistor Amp are connected to a power supply potential Vdd. The other of the source/drain regions of the selection transistor SEL is connected to a signal line 100. In other words, the part on the side of three transistors RST, Amp, and SEL from the floating fusion FD has the same configuration as that of a typical pixel having four transistors (including the transfer transistor of the transistor gate).

Here, in the fourth embodiment, the same components as those in the aforementioned third embodiment are assigned the same reference numerals to omit duplicated descriptions thereof.

According to the above embodiment, two pixels of the basic cell share the floating diffusion FD and the transistors Tr1, Tr2, and Tr3. Therefore, as compared with a case in which floating diffusion FD and transistors Tr1, Tr2, and Tr3 are not shared, the percentage of the surface area of the light receiving unit 1 to the surface area of the pixel can be increased, or the surface area of the light receiving unit 1 can be extended. A decrease in area of the light receiving unit 1 when miniaturizing the pixel can be reduced. Therefore, it is possible to miniaturize the pixel substantially to the minimum wherever possible, while the dimensions of the optical waveguide 3 are prevented from becoming a limit of burying property.

Therefore, it is possible to miniaturize the pixel to cause an increase in integration of the solid-state imaging device. Also, it is possible to provide the imaging apparatus having the solid-state imaging device with more pixels and miniaturize such an imaging device.

According to the present embodiment, on-chip lenses 4 are formed at regular intervals. Thus, so-called invalid zones can be reduced and the generation of loss due to the invalid zone can be prevented.

In addition, according to the present embodiment, the planer position of the optical waveguide 3 is formed so that it can be shifted from the center 1C of the light receiving unit 1 to the transistors Tr1, Tr2, and Tr3. Besides, it is also formed so that it can be included in the inside of the light receiving unit 1 as well as the inside of the on-chip lens 4. Therefore, the light collected by the on-chip lens 4 can be fully led to the optical waveguide 3 and the light passed through the optical waveguide 3 can be then incident on the light receiving unit 1. In addition, the generation of mixed colors occurred when the light passed through the optical waveguide 3 enters the light receiving unit 1 of the adjacent pixel can be prevented.

Therefore, an increase in sensitivity and an increase in efficiency of photoelectric conversion can be attained. Thus, even if pixels are miniaturized, a solid-state imaging device with a sufficient sensitivity and a sufficient efficiency of photoelectric conversion and an imaging apparatus provided with such a soli-state imaging device can be realized.

According to the present embodiment, the optical waveguides 3 are arranged substantially at regular intervals. Thus, by equalizing a change in output due to the incident angle of light, characteristics, such as horizontal stripes, irregular color, and shading, can be improved.

In this fourth embodiment, the center 3C of the optical waveguide 3 and the center of the on-chip lens 4 are substantially coincident with each other. Thus, the light can be efficiently collected and electric charges can be efficiently obtained. The imaging device having such a configuration is preferably used for a camera with a plural-focus optical lens (e.g., a zoom lens).

In the above description, the exemplary solid-state imaging device according to the first embodiment of the present invention includes 36 pixels as shown in FIG. 30. However, the present embodiment is not limited to such a configuration of the solid-state imaging device. In practice, the solid-state imaging device may include tens of thousands or more of pixels.

For example, accumulated eight-million pixels can be obtained by accumulating four-million basic cells (two pixels per cell).

According to any of the above embodiments, two or four pixels of the basic cell share the floating diffusion FD.

In the solid-state imaging device of the present embodiment, the number of pixels of the basic cell, which share the floating diffusion FD, is not specifically limited as long as two or more pixels are included.

Furthermore, if the wiring lines and pixels are arranged in the column and row directions, the layout of pixels can be easily performed when the number of pixels of the basic cell is even.

In each of the above embodiments, the optical waveguide 3 is shifted from the center 1C of the light receiving unit 1 to the upper or lower side where the transistors Tr1, Tr2, and Tr3 are located. In contrast, the optical waveguide 3 is slightly shifted or not shifted from the center 1C of the light receiving unit 1 in the column direction. In other words, the optical waveguide 3 have not been processed by pupil correction.

Here, the imaging device according to any of the above embodiments may be designed so that the optical waveguide 3 is shifted from the center 1C of the light receiving unit 1 in the row direction. For example, in consideration of pupil correction, the optical waveguide 3 is shifted to the left on the right half of the pixel and to the right on the left half thereof. The amount of the shift may be changed depending on the distance from the center C of the imaging device.

In this embodiment, therefore, the solid-state imaging device may be designed for not only performing pupil correction on the on-chip lens but also performing pupil correction on the optical waveguide.

6. Modified Embodiment

Hereinafter, a solid-state imaging device according to a modified embodiment will be described.

Exemplary cross-sectional profiles of an optical waveguide 3 are shown in FIG. 33.

Figure 33A:
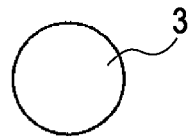
FIGS. 33A to 33D illustrates different examples.
Figure 33B:
Figure 33C:
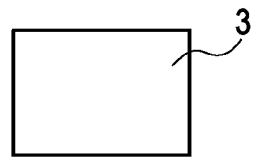
Figure 33D:
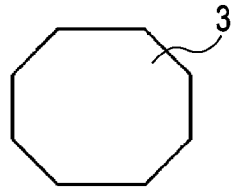

FIG. 33A is a circular optical waveguide like the one shown in FIG. 28. FIG. 33B shows an elliptical optical waveguide. FIG. 33C shows a rectangular (square-shaped) optical waveguide. FIG. 16D shows an octagonal optical waveguide.

Solid-state imaging devices with these different cross-sectional profiles were actually manufactured. Regardless of their cross-sectional profiles, it is found that they can act as solid-state imaging devices without any problem. Obviously, other cross-sectional profiles may be applied to the optical waveguide 3.

Preferably, the cross-sectional profiles of the optical waveguide may be outwardly convexed. It means that a depressed portion and a buried layer for the optical waveguide can be stably formed.

Figure 34:
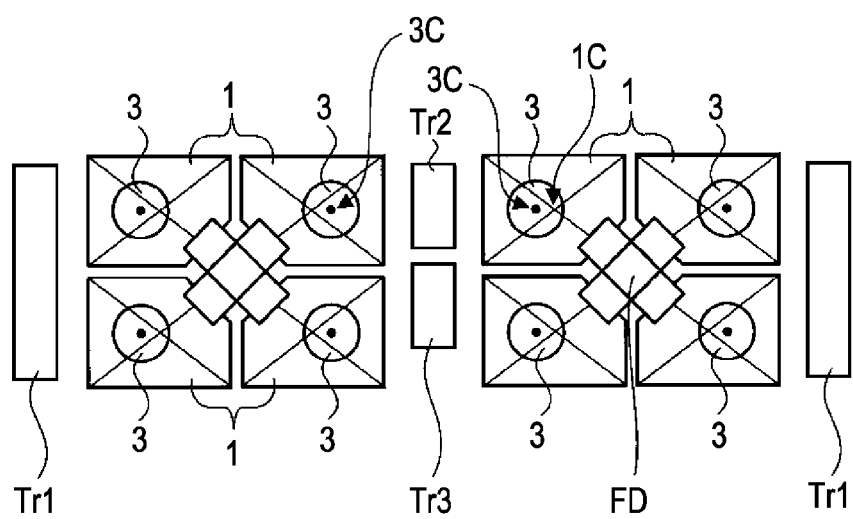
FIG. 34 is a diagram that illustrates the arrangements of transistors, light receiving units, and optical waveguides of a first modified embodiment.
Figure 35:
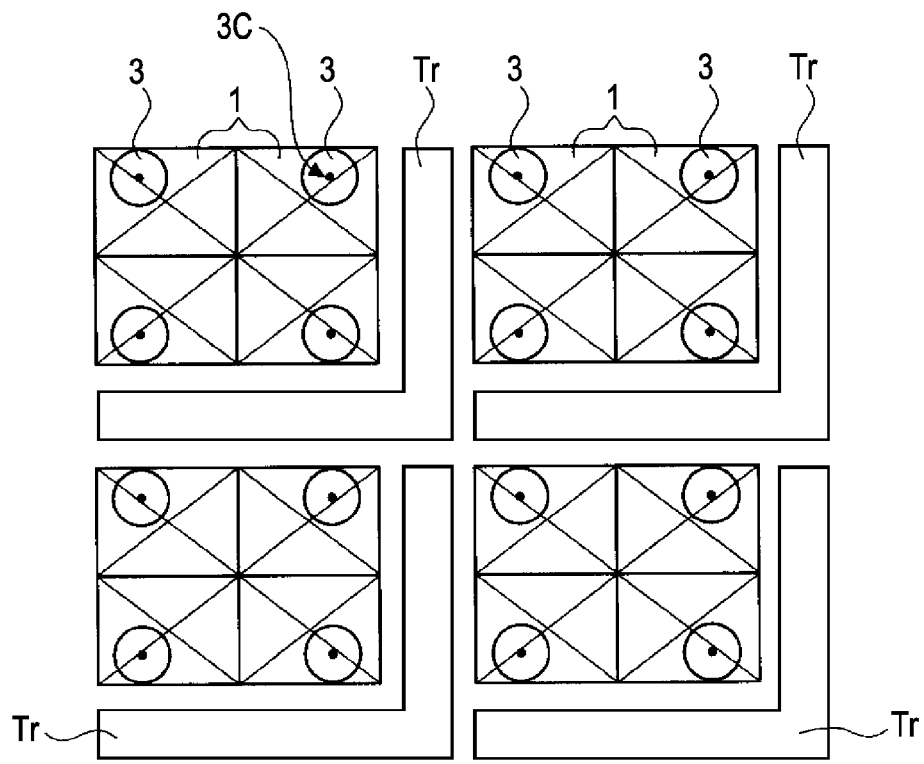
FIG. 35 is a diagram that illustrates the arrangements of transistors, light receiving units, and optical waveguides of a second modified embodiment.
Figure 36:
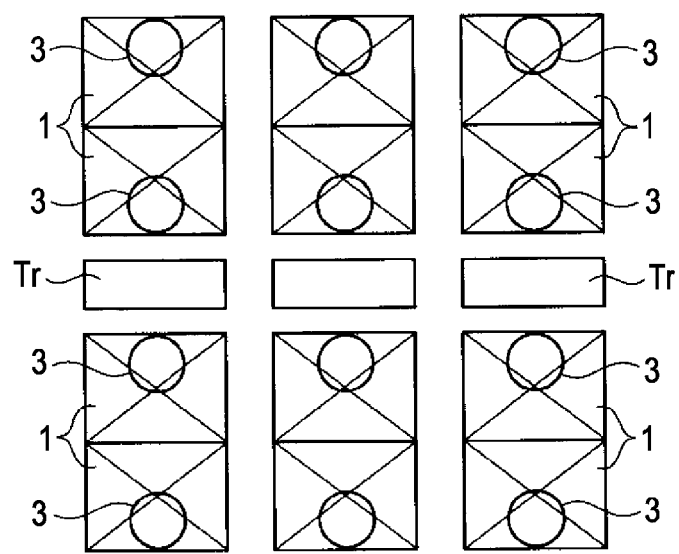
FIG. 36 is a diagram that illustrates the arrangements of transistors, light receiving units, and optical waveguides of a third modified embodiment.

Referring now to FIG. 34 to FIG. 36, exemplary arrangements of transistors and exemplary arrangements of the optical waveguides 3 on the light receiving unit 1 will be described. For the sake of simplification, floating diffusion is not illustrated in FIG. 34 to FIG. 36.

In the second modified embodiment shown in FIG. 34, additional transistors Tr are arranged on the right and left sides of the basic cell with four pixels that share the floating fusion.

In two pixels on the left side of the basic cell, the optical waveguide 3 is shifted from the center of the light receiving unit 1 to the left.

In two pixels on the right side of the basic cell, the optical waveguide 3 is shifted from the center of the light receiving unit 1 to the right.

In the first modified embodiment shown in FIG. 35, transistors Tr are arranged on the right and lower sides of the basic cell with four pixels that share the floating fusion.

In this case, in the basic cells on the second or later row from the upper side, transistors Tr are arranged on the left, right, upper and lower sides of the respective basic cells.

In the pixel on the upper left of the basic cell, the optical waveguide 3 is shifted from the center of the light receiving unit 1 to the upper left.

In the pixel on the upper right of the basic cell, the optical waveguide 3 is shifted from the center of the light receiving unit 1 to the upper right.

In the pixel on the lower left of the basic cell, the optical waveguide 3 is shifted from the center of the light receiving unit 1 to the lower left.

In the pixel on the lower right of the basic cell, the optical waveguide 3 is shifted from the center of the light receiving unit 1 to the lower right.

In a third modified embodiment shown in FIG. 36, each basic cell is constructed of two pixels which are arranged in the column direction and share floating diffusion. In this example, transistors Tr are arranged on the upper and lower sides of a basic cell.

In the pixel on the upper side of the basic cell, the optical waveguide 3 is shifted upward from the center of the light receiving unit 1.

In the pixel on the lower side of the basic cell, the optical waveguide 3 is shifted downward from the center of the light receiving unit 1.

In each of the third and fourth embodiments described above, the description has been made with respect to the imaging device in which the center C thereof is located on the floating fusion FD on the center of the pixels in the basic cell. In the present invention, the position of the center of the imaging device is not only limited to the position of the floating diffusion FD and may be alternatively located on another place. For example, it may be located in the inside of the pixel, such as the inside of the light receiving unit, or located between the basic cells, such as on a place near the transistor therebetween.

Figure 37:
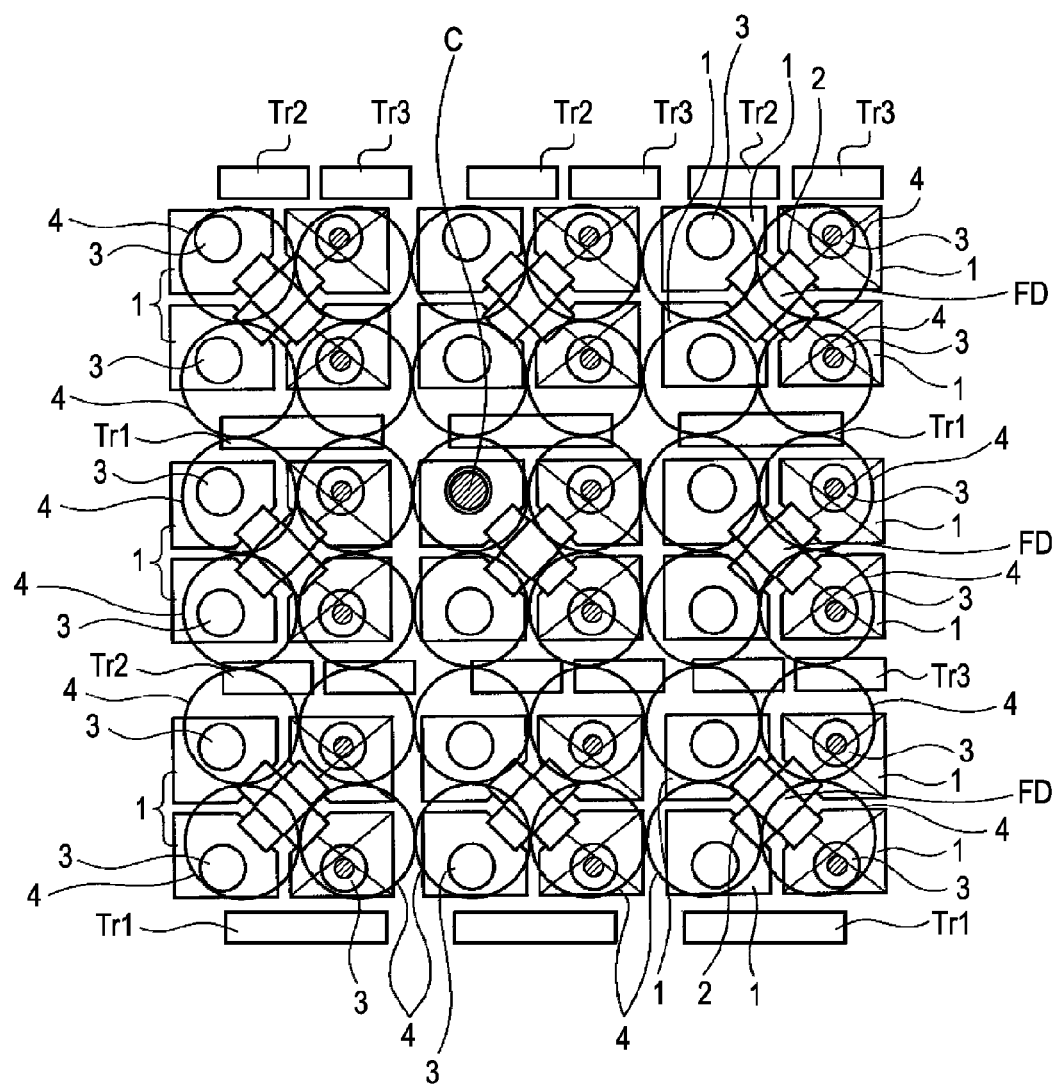
FIG. 37 is a diagram that illustrates a modified embodiment corresponding to the embodiment shown in FIG. 22 but different in position of the center of the imaging device.
Figure 38:
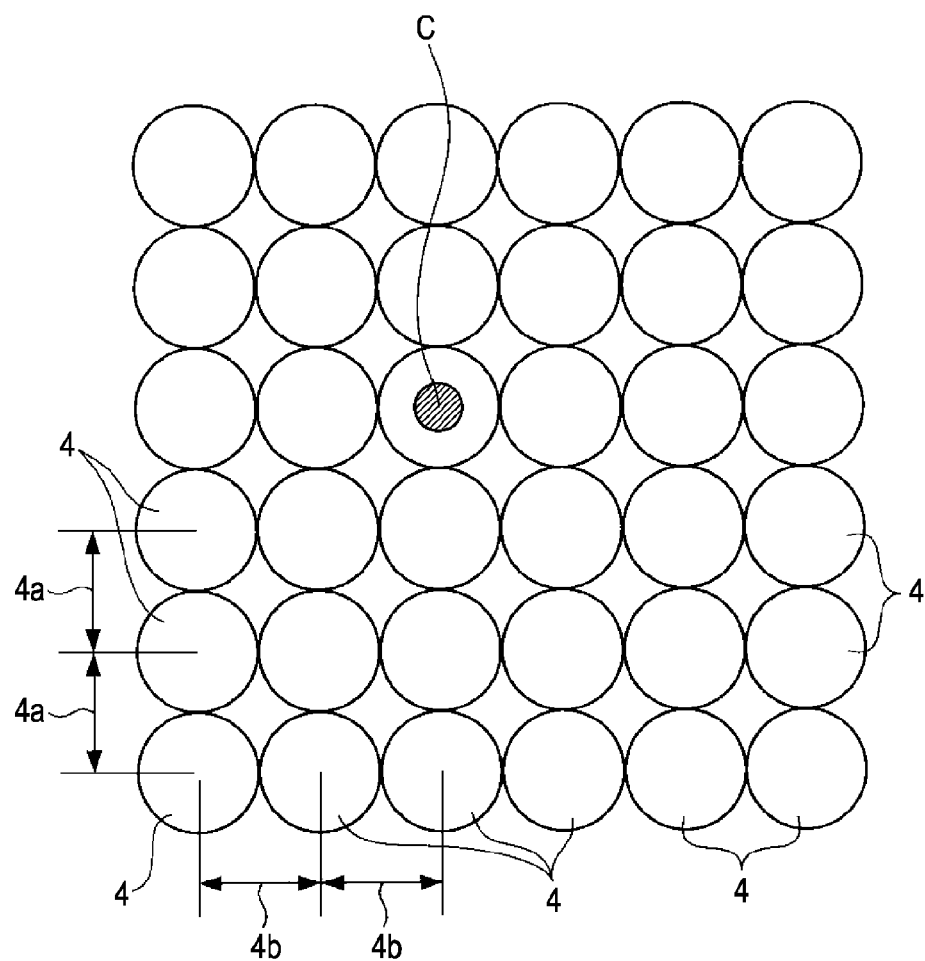
FIG. 38 is a diagram that illustrates a modified embodiment corresponding to the embodiment shown in FIG. 25 but different in position of the center of the imaging device.

Referring now to FIG. 37 and FIG. 38, which are plane views corresponding to FIG. 22 and FIG. 25, a modified embodiment with the center C of the imaging device located in the inside of the light receiving unit will be described. As shown in FIG. 37 and FIG. 38, the center C of the imaging device is located in the inside of the light receiving unit 1 and near the center of the on-chip lens 4.

7. Imaging Apparatus According to Embodiment of the Present Invention

Next, an imaging apparatus according to an embodiment of the present invention will be descried.

Figure 39:
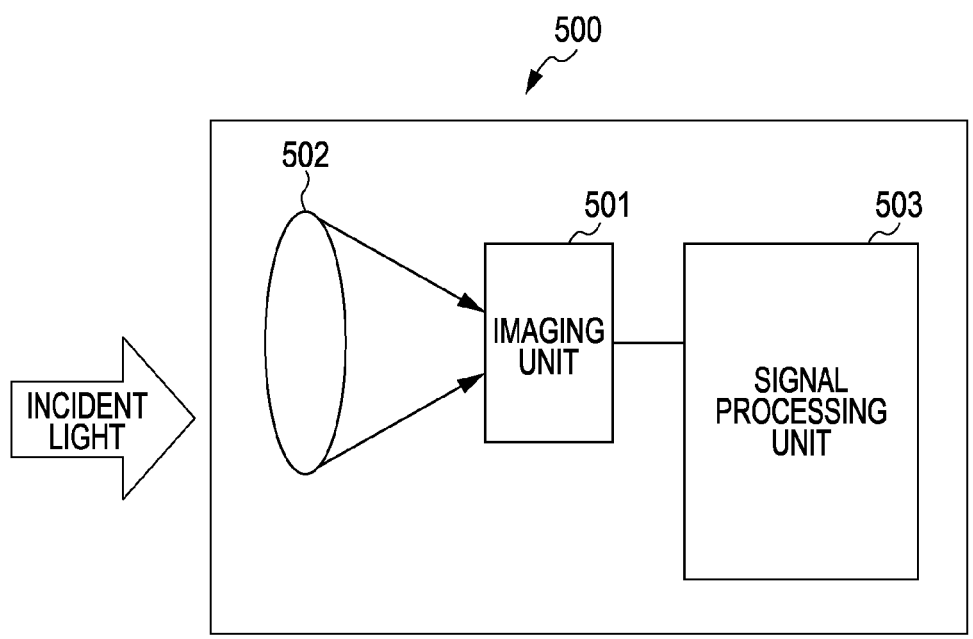
FIG. 39 is a block diagram schematically illustrating the configuration of the imaging apparatus according to the embodiment of the present invention.

FIG. 39 is a block diagram schematically illustrating the configuration of the imaging apparatus according to the embodiment of the present invention.

Examples of the imaging apparatus include a video camera, a digital still camera, and a cellular phone camera.

As shown in FIG. 39, the imaging apparatus 500 includes an imaging unit 501 provided with a solid-state imaging device (not shown). An imaging optical system 502 is connected upstream of the imaging unit 501 and provided for condensing incident light to form an image. In addition, a signal processing unit 503 is connected downstream of the imaging unit 501. The signal processing unit 503 includes a drive circuit for driving the imaging unit 501, a signal processing circuit for producing an image from a signal photoelectrically converted by the solid-state imaging device, and so on. In addition, an image signal processed by the signal processing unit 503 and then stored in an image storage unit (not shown).

In such imaging apparatus 500, the solid-state imaging device is one according to any of the embodiments of the present invention, such as one as described above.

In the imaging apparatus 500 of the present embodiment, the solid-state imaging device of any of the embodiments of the present invention is used. In the solid-state imaging device, as described above, the position of the center 3C of the optical waveguide 3 in the surface of the solid-state imaging device is shifted from the center 1C of the light receiving unit 1. Thus, even if pixels are finely formed, the solid-state imaging device can attain sufficient sensitivity and conversion efficiency.

Therefore, the pixels of the solid-state imaging device can be miniaturized. It leads to advantages of providing the imaging apparatus 500 with more pixels, miniaturizing such an imaging apparatus, allowing the imaging apparatus 500 to take an image in a comparatively dark place, and so on.

The configuration of the imaging apparatus of the present embodiment is not limited to one illustrated in FIG. 39. Any configuration of the imaging apparatus is applicable as long as the solid-state imaging device of any of the embodiments of the present invention is used.

For instance, the solid-state imaging device may be in the form of one-chip, or may be in the form of a module in which an imaging unit and a signal processing unit or an optical system are packaged together.

The imaging apparatus according to the embodiment of the present invention may be applied to any of various imaging apparatuses, such as cameras and portable devices with imaging functions. Furthermore, the term "imaging" is also applicable to a fingerprint detection apparatus or the like in an expanded sense.

The present invention is not limited to any of the above embodiments but can be embodied in any of various configurations without departing from the gist of the present invention.

The present application contains subject matter related to that disclosed in Japanese Priority Patent Application JP 2009-088093 filed in the Japan Patent Office on Mar. 31, 2009 and Japanese Priority Patent Application JP 2009-088094 filed in the Japan Patent Office on Mar. 31, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels arranged in a matrix, each pixel of the plurality of pixels including a light receiving unit to perform photoelectric conversion, an optical waveguide buried in an insulating layer located above said light receiving unit, and an on-chip lens located above said optical waveguide;
a basic cell having two or more of said pixels that share a floating diffusion; and
a transistor shared by said two or more pixels in said basic cell,
wherein,
said light receiving unit is connected to said floating diffusion shared by said two or more pixels in said basic cell through a transfer gate, and
an optical waveguide of a first pixel of the basic cell is formed such that a distance from a center of the matrix of the imaging device to a center of the optical waveguide of the first pixel of the basic cell is longer than a distance from the center of the matrix of the imaging device to a center of the light receiving unit of the first pixel of the basic cell.

2. The solid-state imaging device according to claim 1, wherein said on chip lenses of the respective pixels are arranged substantially at regular intervals.

3. The solid-state imaging device according to claim 1, wherein
said optical waveguide includes a passivation film formed on a wall surface on the side of said insulating layer, and
a buried layer in the inside of said passivation film.

4. The solid-state imaging device according to claim 3, wherein
said passivation film is made of silicon oxynitride.

5. The solid-state imaging device according to claim 1, wherein an optical waveguide of a second pixel of the basic cell is formed such that a distance from the center of the matrix to a center of the optical waveguide of the second pixel of the basic cell is shorter than a distance from the center of the matrix to a center of the light receiving unit of the second pixel of the basic cell.

6. An imaging apparatus comprising:
a converging optical section that collects incident light;
a solid-state imaging device having a plurality of pixels arranged in a matrix, each pixel of the plurality of pixels including a light receiving unit to perform photoelectric conversion, an optical waveguide buried in an insulating layer located above said light receiving unit, and an on-chip lens located above said optical waveguide, said solid state imaging device further including:
a basic cell having two or more of said pixels that share a floating diffusion; and
a transistor shared by said two or more pixels in said basic cell, wherein
said light receiving unit is connected to said floating diffusion shared by said two or more pixels in said basic cell through a transfer gate, and
an optical waveguide of a first pixel of the basic cell is formed such that a distance from a center of the matrix to a center of the optical waveguide of the first pixel of the basic cell is longer than a distance from the center of the matrix to a center of the light receiving unit of the first pixel of the basic cell,
wherein,
the imaging apparatus further includes a signal processing section that processes a signal obtained by photoelectric conversion in said solid-state imaging device and said on-chip lenses are arranged substantially at regular intervals.

7. The imaging apparatus according to claim 6, wherein
said optical waveguide includes a passivation film formed on a wall surface on the side of said insulating layer, and
a buried layer in the inside of said passivation film.

8. The imaging apparatus according to claim 7, wherein
said passivation film is made of silicon oxynitride.

9. The imaging apparatus according to claim 6, wherein an optical waveguide of a second pixel of the basic cell is formed such that a distance from the center of the matrix to a center of the optical waveguide of the second pixel of the basic cell is shorter than a distance from the center of the matrix to a center of the light receiving unit of the second pixel of the basic cell.

* * * * *